United States Patent [19]
Nolan et al.

[11] Patent Number: 5,508,228
[45] Date of Patent: Apr. 16, 1996

[54] COMPLIANT ELECTRICALLY CONNECTIVE BUMPS FOR AN ADHESIVE FLIP CHIP INTEGRATED CIRCUIT DEVICE AND METHODS FOR FORMING SAME

[75] Inventors: Ernest R. Nolan, Round Rock; Diana C. Duane, Cedar Park, both of Tex.; Todd H. Herder, Corvallis, Oreg.; Thomas A. Bishop, Austin, Tex.; Kimcuc T. Tran, Austin, Tex.; Robert W. Froehlich, Austin, Tex.; Randy L. German, Austin, Tex.; Richard D. Nelson, Austin, Tex.; Chung J. Lee, Austin, Tex.; Mark R. Breen, Austin, Tex.; Kathryn V. Keswick, Austin, Tex.

[73] Assignee: Microelectronics and Computer Technology Corporation, Austin, Tex.

[21] Appl. No.: 195,434

[22] Filed: Feb. 14, 1994

[51] Int. Cl.⁶ .................................................. H01L 21/44
[52] U.S. Cl. .......................... 437/183; 437/189; 437/192; 437/203
[58] Field of Search .................................. 437/183, 189, 437/190, 192, 193, 194, 203; 156/654, 655, 656, 657; 257/759

[56] References Cited

U.S. PATENT DOCUMENTS

| | | | |
|---|---|---|---|
| 4,640,499 | 2/1987 | Hemler et al. | 267/160 |
| 4,682,829 | 7/1987 | Kunkle et al. | 439/83 |
| 4,692,791 | 9/1987 | Bayraktaroglu | 257/712 |
| 4,693,770 | 9/1987 | Hatada | 156/151 |
| 4,696,885 | 9/1987 | Vijan | 430/311 |
| 4,716,058 | 12/1987 | Morin | 427/420 |
| 4,740,700 | 4/1988 | Shaham et al. | 156/650 |
| 4,848,639 | 7/1989 | Belanger, Jr. | 228/5.5 |
| 4,859,189 | 8/1989 | Petersen et al. | 439/66 |
| 5,071,787 | 12/1991 | Mori et al. | 437/183 |
| 5,074,947 | 12/1991 | Estes et al. | 156/307.3 |
| 5,187,020 | 2/1993 | Kwon et al. | 428/601 |
| 5,189,502 | 2/1993 | Gomi | 297/759 |
| 5,196,371 | 3/1993 | Kulesza et al. | 437/183 |
| 5,208,186 | 5/1993 | Mathew | 437/183 |
| 5,223,321 | 6/1993 | Sinnadurai et al. | 428/138 |
| 5,223,454 | 6/1993 | Uda et al. | 437/189 |
| 5,246,880 | 9/1993 | Reele et al. | 437/183 |
| 5,284,797 | 2/1994 | Heim | 437/203 |
| 5,290,732 | 3/1994 | Kumar et al. | 437/183 |

OTHER PUBLICATIONS

J. Simon, A. Ostmann, and H. Reichl, "*Electroless Bumping for TAB and Flip Chip*," Proceedings of the 1993 International Symposium on Microelectronics, Nov. 9–11, 1993, Dallas, Texas, pp. 439–444.

J. Simon, E. Zakel, and H. Reichl, "*Electroless Deposition of Bumps for TAB Technology*," Technische Universität Berlin, pp. 412–417. Date Unknown.

A. Ostmann, J. Simon, and H. Reichl, "*The Pretreatment of Aluminum Bondpads for Electroless Nickel Bumping*," Technische Universität Berlin, pp. 74–78. Date Unknown.

T. O. Herndon, J. I. Raffel, and J. F. Howard, "*Polyimide Microposts for Ultrahigh Density Interconnect*". Date Unknown.

H. Kenzo, F. Hiroaki, and K. Tetsuro, "*A Direct Mounting of a 4000-pin LSI Chip Using a Photo–Hardening Resin*", Nikkei Microdevices, Sep. 1987, pp. 107–115.

(List continued on next page.)

*Primary Examiner*—Brian Hearn
*Assistant Examiner*—Kevin M. Picardat
*Attorney, Agent, or Firm*—Baker & Botts

[57] ABSTRACT

Compliant electrically connection bumps for an adhesive flip chip integrated circuit device and various methods for forming the bumps include the steps of forming polymer bumps on a substrate or an integrated circuit die and coating the polymer bumps with a metallization layer. The polymer bump forming step includes the steps of coating a polymer material on a substrate, curing the polymer and the etching the bump pattern from the polymer material. The overcoating step includes electrolessly plating a ductile metal such as gold on the polymer bump.

37 Claims, 12 Drawing Sheets

OTHER PUBLICATIONS

K. Keswick, R. German, M. Breen, and R. Nolan, "*Compliant Bumps for Adhesive Flip Chip Assembly*". Date Unknown.

T. O. Herndon, J. I. Raffel, and J. F. Howard, "*Polymide Microposts for Ultrahigh Density Interconnect*", Proceedings from the 5th Meeting of the Dupont Symposium on High Density Interconnects and Thin Film, Oct. 4–6, 1993, pp. 635–661.

P. B. Horgerton, J. B. Hall, J. M. Pujol, and R. S. Reylek, "*Investigations into the Use of Adhesives for Level–1 Microlectronic Interconnections*", Materials Research Society Symp. Proc., vol. 154, pp. 415–424. Date Unknown.

AVERAGE RESISTANCE THROUGH 216 BUMP DAISY CHAIN STRUCTURE (Ω)

COMPLIANT ELECTRICALLY CONNECTIVE BUMPS FOR AN ADHESIVE FLIP CHIP INTEGRATED CIRCUIT DEVICE AND METHODS FOR FORMING SAME

GOVERNMENT RIGHTS

The U.S. Government has a paid-up license in this invention and right in limited circumstances to require the patent owner to license others on reasonable terms as provided for by the terms of contract No. NIST/ATP 70NANB1H1114 awarded by the National Institute of Standards and Technology (NIST).

TECHNICAL FIELD OF THE INVENTION

The invention relates to forming compliant bumps on a flip chip device using a polymer bump that is coated with a thin layer of metal to provide economical, compliant, and reworkable electrical connections for adhesive flip chip assemblies.

BACKGROUND OF THE INVENTION

In recent years, there have been several efforts to commercialize adhesive flip chip technologies. In the course of these efforts, manufacturers have learned of numerous reliability and manufacturing barriers that inhibit the wide spread use of adhesive flip chip assemblies. Failures occur in adhesive flip chip assemblies on glass or ceramic substrates for a variety of reasons. Electrical connections in most adhesive flip chip technologies occur through compressed contact points between the chip and substrate. As used herein, "substrate" refers generally to any material on which a plurality of electrical conductors can be constructed, deposited, etc. This design requires that tensile stress in the adhesive create and maintain the electrical contact throughout the life of the assembly. Loss of electrical contact can occur, however, when the adhesive expands or swells in the Z-axis direction. Expansion or swelling in the Z-direction may occur due to thermal expansion or moisture absorption. Gross delamination and tensile stress cracking may occur in the adhesive when the bond stresses are excessive. These can also cause Z-direction movement.

Adhesive flip chip assemblies often use protruding solid metal bumps or (in the case of anisotropically conducting adhesives) metal-coated polymer or solid metal particles to electrically connect a chip to the substrate. The flip chip systems use these bumps or particles because the chip pad is typically recessed 1 μm or more beneath the chip passivation coating. Other chip or substrate topographies such as a warped or twisted substrate may preclude electrical contact without some sort of bump or particle between the chip and substrate. In the case of flip chip technologies that use anisotropically conducting adhesives, the particles are relatively small. Many particles have a diameter of less than approximately 10 μm. The resulting bond line thickness for such a bump is also less than 10 μm. This permits placing the bumps closely together without their touching one another. In these devices, reliable Z-axis connectivity occurs without undesirable lateral connections. High tensile stresses arise in these devices, however, particularly at the corners of the chip due to the thin adhesive bond line.

Flip chip assemblies that use solid metal bumps have an advantage of permitting bump height adjustments that optimize the bond line thickness to produce optimal stress levels. An example of a solid metal bumping technique appears in U.S. Pat. No. 4,693,770, entitled "Method of Bonding Semiconductor Devices Together," by K. Hatada, issued on Sep. 15, 1987, and assigned to Matsushita Electric Industrial Company, Limited (hereinafter Hatada). Hatada uses a solid gold bump to form the electrical connection from a die to a substrate. This is typical of LCD applications. A major problem with the device of Hatada, however, is that it is prone to fail due to adhesive creep-relaxation. But this is not the only problem with, solid metal bump configurations.

The coefficient of thermal expansion (CTE) of a solid metal bump is typically much lower than that of the adhesive that holds the flip chip device in contact with the substrate. As the flip chip increases in temperature, therefore, the adhesive expands faster than does the bump. This causes the flip chip to separate from the substrate. This thermal expansion, consequently, opens the circuit between the flip chip and the substrate.

Because of these issues, adhesive flip chip assemblies that use solid metal bumps require adhesives that possess extraordinary mechanical properties. The adhesives must have a low CTE and moisture absorptivity. In addition, the adhesive glass transition temperature, storage modulus, tensile and adhesion strengths must be high. Few adhesives have these properties. Those that do generally have manufacturing problems such as having short pot lives, lacking reworkability, producing residual ionics, and requiring long cure times.

Yet another limitation of existing flip chip bonding techniques relates to the point in the fabrication process at which bonding occurs. Most manufacturers of multi-chip electronic assemblies do not produce all of the integrated circuit die chips in their designs. Instead, they frequently purchase integrated circuit dies from various manufacturers who may not offer a flip chip bumping process. Often, these advanced chip manufacturers are very protective of any information that could be used by competitors or customers to deduce the cost of producing the chips. For this reason, they often refuse to supply integrated circuit chips in wafer form. This is because the complete wafers will indicate the integrated circuit yield from the wafers. The electrical yield of good chips per wafer is a primary cost driver. A competitor's knowledge of this cost information, therefore, can be detrimental to the business interests of the manufacturer. The inability to post-process flip chip devices on whole wafers to form these bumps limits the utility of flip-chip technology in multi-chip modules.

Consequently, the related art does not teach how to form a flip chip bump that overcomes the reliability and manufacturing barriers associated with making and using known electrically connective bumps.

The related art does not teach a method for forming connection bumps for adhesive flip chip assemblies that yields a bump that avoids tensile stress cracking, gross delamination, and loss of electrical contact problems of known adhesive flip chip assembly bumps. There is no teaching of an adhesive flip chip assembly bumping technology that ensures reliable Z-axis conductivity, and that overcomes the CTE-related problems of known adhesive flip chip assembly bumps.

There is no flip chip bump forming process that eliminates the need for adhesives that have the extraordinary mechanical properties of low CTE and moisture absorption together with a high glass transition temperature, storage modulus, and tensile and adhesion strength. The related art, furthermore, does not teach a method to connect bumps for adhesive flip chip assemblies that makes unnecessary special preparation of the assembly die.

SUMMARY OF THE INVENTION

It is an object of the present invention, therefore, to provide a method for forming compliant connection bumps for adhesive flip chip assemblies that substantially eliminates or reduces disadvantages and problems associated with known connection bumps for adhesive flip chip assemblies and their methods for formation.

Another object of the present invention is to provide a method for forming compliant bumps for an adhesive flip chip assembly that includes the steps of forming polymer bumps on an integrated circuit bond pad of the adhesive flip chip assembly and coating the polymer bumps with a metallization layer.

A feature of the present invention is that the polymer bump forming step includes the steps of coating a polymer material on a substrate followed by curing the polymer material. A next step is to define an etch pattern on the polymer material using an etch mask. Patterning then occurs based on the etch mask pattern. The polymer material is then etched away to form the polymer bumps. The etching step may include plasma etching or wet chemical etching the polymer material to form the polymer bump. The polymer bump forming step may include coating a photo-imageable polymer material on the substrate, pre-baking the polymer, and then exposing the photo-imageable polymer material to develop the photo-imageable polymer material into the polymer bump.

Another feature of the present invention is that coating the polymer bump may include the steps of depositing a thin plating buss on the substrate and defining the areas to be plated by applying a plating mask to the thin plating buss. The coating step includes electroplating the metallization layer in the areas that the plating mask defines. A next step is to remove the plating mask and plating buss. The coating step may, alternatively, include applying a plating catalyst to the polymer bump and then electrolessly plating a ductile material, such as gold, on the polymer bump. Yet a second alternative of the coating step may include depositing the metal over the entire surface to a desired thickness and then applying an etch mask to the bumps. The next step of this second alternative process is to etch the field metal away according to the etch areas that the etch mask defines. Another alternative is to pre-mix the catalyst with the photo-imageable polyimide prior to coating and patterning, and then electrolessly plating the metal layer.

Yet another feature of the present invention is that it provides a way to form compliant bumps for an adhesive flip chip assembly either directly on a chip or on substrate bond pads. The present invention uses standard bump forming processes and equipment to form the polymer bumps on integrated circuit wire bond pads. The pad and bump are then coated by a metallization layer. The metal-coated bumps, in one embodiment, are compliantly compressible to 30% of the total bump height. This dramatically alters the mechanical attributes required of the flip chip bonding adhesive. The process of the present invention, therefore, yields a reliable, cost effective adhesive flip chip assembly using commercially available adhesives that permits rework.

Forming bumps on the integrated circuit wafer is generally most cost effective because many chips are prepared for each piece processed. Substrate bumping results in fewer chip sites bumped per piece processed, and this leads to higher processing costs. It is attractive to form bumps on the substrate, however, if the resulting flip-chip assembly includes chips that come from many different suppliers or from suppliers who will not provide complete wafers for bumping. The present invention accommodates these different processes.

Another technical advantage of the present invention is that the compliant polymer that forms part of the compliant bump provides a mechanism that compensates for warp or non-planarities in the substrate or die as well as for pad height non-uniformities. Better bump height uniformity may be achieved using the present invention than is possible with conventional techniques that electroplate solid metal bumps. For example, the polymer bump non-uniformity measurements from a sample of bumps formed according to the present invention was approximately 3% of average bump height. Solid metal bump non-uniformities formed according to the best conventional methods, on the other hand, average approximately 10% of bump height.

Polymers also respond compliantly over a larger range of displacements than do metals. These factors allow bonding forces to be lower than with solid metal bumps. This is because there is no need for the excessive bonding forces used to plastically deform metal bumps to correct for bump non-uniformities. The present invention, accordingly permits use of a wider range of bonding parameters while ensuring electrical connectivity between the flip chip device and the substrate.

Still a further technical advantage of the present invention is that it permits optimizing process parameters to reduce as-bonded stress. In conventional adhesive flip chip systems, as-bonded stress is maximized to ensure against loss of electrical contact due to moisture-induced swelling, creep-relaxation, and thermal expansion. With the compliant bumps of the present invention, the bump tends to spring back to its original height. The bump, therefore, will maintain a contact force commensurate with its effective compression modulus until it has returned to its original height. In addition, the present invention permits tailoring the effective compression modulus of the bump by adjusting the polymer composition and cure parameters as well as the metal plating thickness.

These and other objects, features, and technical advantages of the present invention will be more readily apparent from a review of the detailed description and preferred embodiments which follow.

BRIEF DESCRIPTION OF THE DRAWINGS

The following description of the preferred embodiments can best be understood when read in conjunction with the accompanying drawings, wherein.

DETAILED DESCRIPTION OF THE INVENTION

Figure 1:
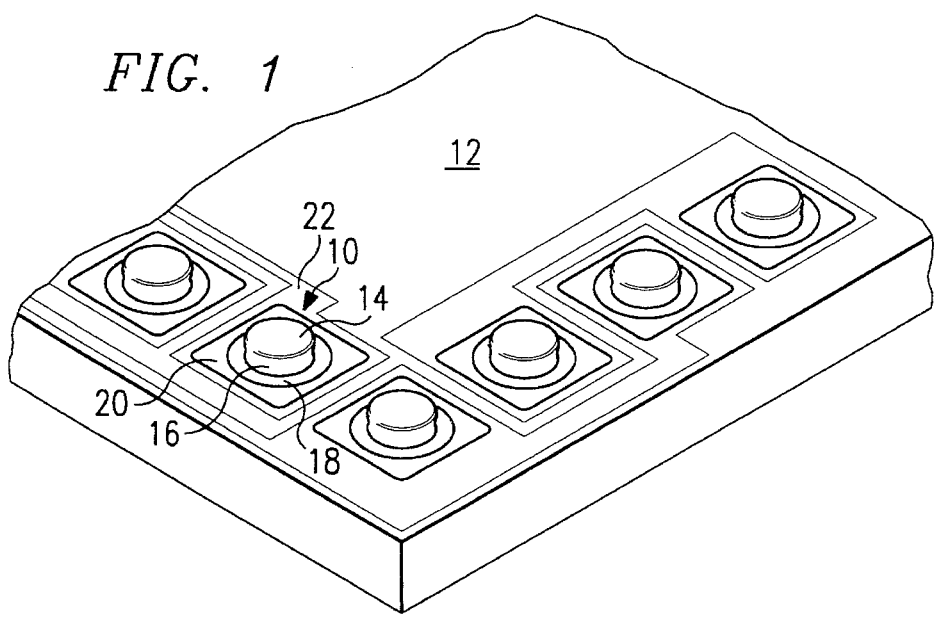
FIG. 1 provides an oblique view of compliant bumps formed according to the present embodiment.

Reference is now made to the drawings wherein depicted elements are not necessarily shown to scale and wherein like or similar elements are designated by the same reference numeral through the several views and, more particularly, to FIG. 1 where compliant bump 10 appears according to a particularly preferred exemplification of the present invention.

FIG. 1 shows an oblique view of a compliant bump 10 formed according to the present embodiment formed on IC chip 12. Compliant bump 10 includes top surface 14 that connects to side portion 16. Side portion 16 is substantially vertical relative to a horizontal IC chip 12 and connects to base 18. Compliant bump 10 may be formed on bond pad 20 of IC chip 12 to provide connection to lead 22.

Figure 2:
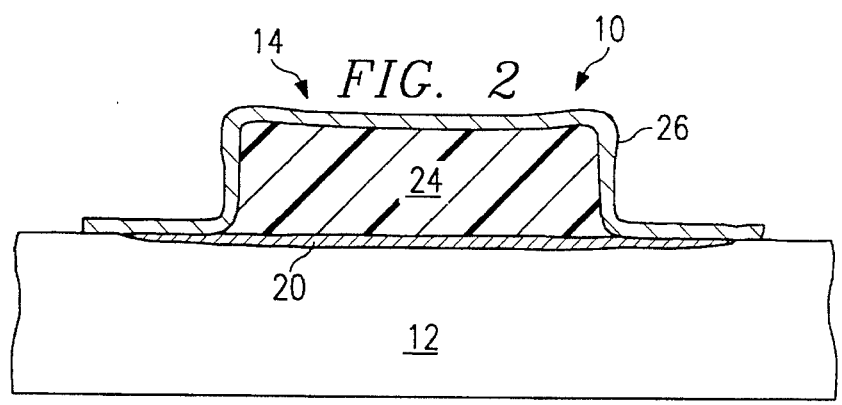
FIG. 2 provides a cross-sectional view of a compliant bump formed according to the method of the present embodiment.
Figure 3:
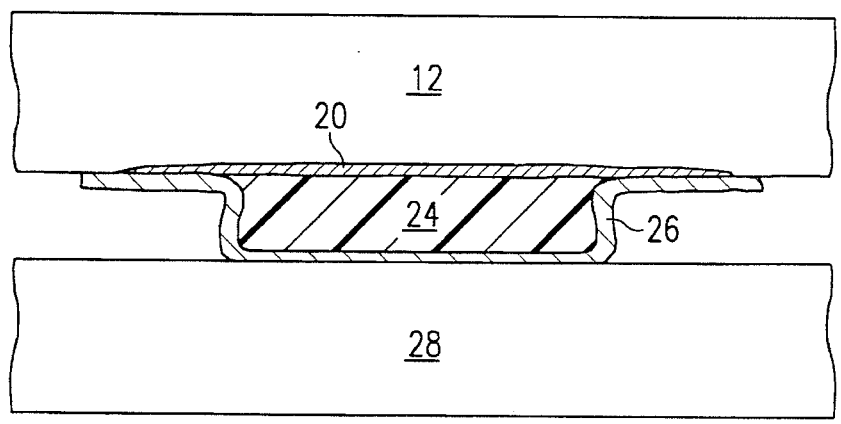
FIG. 3 illustrates a compliant bump formed according to the present embodiment assembled to a glass substrate using 20 lbs. assembly force.
Figure 4:
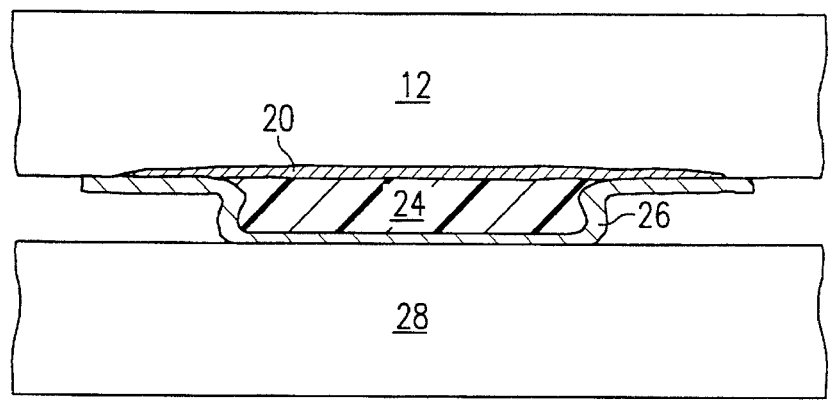
FIG. 4 shows a compliant bump assembled to a glass substrate using 60 lbs. assembly force.

FIGS. 2 through 4 show cross-sectional views of compliant bump 10 to more clearly illustrate its constituent parts. Referring first to FIG. 2, on IC chip 12 is wire bond pad 20. Polymer bump 24 attaches to wire bond pad 20. Gold metallization layer 26 covers both polymer bump 24 and may cover at least a portion of bond pad 20. FIG. 3 shows how compliant bump 10 may attach to flipped IC chip 12 and adhere to borosilicate glass substrate 28. Bump 10 has been assembled to borosilicate glass substrate 28 with conductors using 20 lbs. assembly force in FIG. 3. Compliant bump 10 is compressed to about 85% of its original height in the FIG. 3 application relative to the uncompressed state that FIG. 2 shows. FIG. 4 shows compliant bump 10 assembled to borosilicate glass substrate 28 using an assembly force of 60 lbs. The 60-pound assembly force results in an approximately 30% compression of compliant bump 10.

Compliant bump 10 may be formed on substrates or on an integrated circuit chip. Gold metallization layer 26 serves as a coating on polymer bump 24 and bond pad 20. For the present embodiment, compliant bump 10 has a height 14 of approximately 17 µm. This height was determined to be optimal through finite element analysis and test results. The diameter of compliant bump 10 preferably ranges from 18 to 93 µm. The compliancy of polymer bump 24 provides a mechanism by which the bumps may adjust for warp or nonplanarities in substrate 28 and for wire bond pad 20 height non-uniformities. Better bump height uniformity can be achieved with polymer bump 24 processing relative to that achievable using conventional electroplating techniques. Polymer bump 24 height variation was measured at 3%, whereas gold bump height variations average 10%. Polymer bump 24 responds compliantly over a larger range of displacements than would a comparably sized solid metal bump. These factors allow lower bonding forces with compliant bump 10 than is possible with solid metal bumps. This is because there is no need to plastically deform compliant bump 10, as is the case with metal bumps, to correct for bump non-uniformities. A wider range of bonding parameters can be used, therefore, while ensuring electrical connectivity. The combination of polymer bump 24 and metallization layer 26 significantly alters the mechanics of adhesive flip chip bonding to provide a reliable cost-effective flip chip assembly for which rework is possible using commercially available adhesives.

The present embodiment permits optimizing process parameters to reduce as-bonded stresses. In conventional adhesive flip chip systems, as-bonded stresses are maximized to provide insurance against loss of electrical contact; due to moisture-induced swelling, creep-relaxation, and thermal expansion. But compliant bump 10 has a tendency to spring back to its original height following compression. Even if compliant bump 10 has a lower coefficient of thermal expansion (CTE) than the bonding adhesive and even if the bonding adhesive absorbs moisture and swells, compliant bump 10 maintains a contact force commensurate with its effective compression modulus until compliant bump 10 returns to its original height. In addition, the effective compression modulus of compliant bump 10 may be tailored by adjusting the polymer composition of polymer bump 24 as well as the metallization layer 26 thickness. Yet another way to modify the polymer bump 24 compression modulus is to adjust the curing rate and time.

Desired properties for polymer bump 24 are high glass transition temperature ($T_g$), high yield stress, linear elastic response over a large stress-strain region and high compressive strength. High $T_g$ is optimum for assemblies that operate at elevated temperatures. Material creep occurs at temperatures near the $T_g$. If the $T_g$ is too near the high end of the operating temperature region, then material creep could cause loss of electrical function. The elastic modulus of compliant bump 10 may vary slightly with temperature, but is not markedly temperature dependent. Therefore, a high modulus of elasticity is desirable, but not required. A modulus of elasticity that is too high could be detrimental. This is because a high modulus could result in a very brittle material that fractures under large bonding forces. Many known polymers satisfy these requirements.

In the present embodiment, several approaches to forming polymer bump 24 are possible. They include a dry etch process, a wet etch process, and a photo-imaging process. Each process uses a polymer material as the core of polymer bump 24, but forms polymer bump 24 by different processing sequences. In each process, polymer material is applied to IC chip 12. The polymer material is imaged or masked and then removed from the field areas and the bump is formed on conductive layers that form bond pad 20.

The preferred embodiment of the present invention uses photo-imageable processing to form polymer bump 24. In this approach, IC chip 12 is coated with polymer 24 which is formed using a photo-imageable polymer. Polymer bump 24 is formed by directly exposing and developing the polymer material. The advantages to this approach are that bump size and shape may be modified by varying the exposure parameters, large aspect ratios are obtainable, and processing is quick and simple and can be done with conventional photolithography equipment. Bump height uniformities are very good with this approach.

In one embodiment of the present invention, it is possible to form compliant bump 10 on a fabricated semiconductor wafer. FIGS. 5a–5i, therefore, illustrate the process of forming compliant bump 10 on a pre-existing semiconductor device. The process flow that FIGS. 5a–5i illustrate provides an improved method for forming compliant bump 10 on an already fabricated integrated circuit flip chip assembly that achieves important cost reduction and reliability improvement objectives.

Figure 5A:
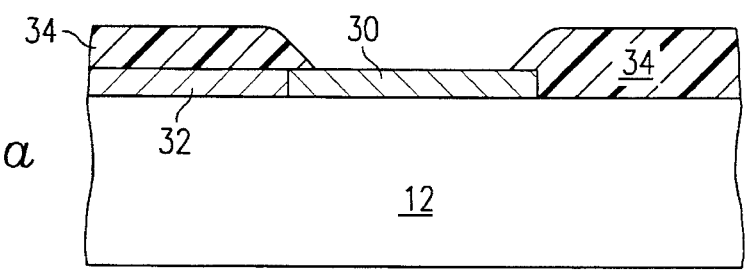
FIGS. 5a through 5i illustrate forming the compliant bump on a substrate of the present embodiment on a previously fabricated integrated circuit device.

Referring to FIG. 5a, there appears silicon substrate 12 on which appears aluminum pad 30 and conductor 32 that passivation layer 34 covers except for areas intended for wire bonding. This layer is a standard part of established integrated circuit fabrication process and, in this embodiment of the invention protects aluminum bond conductor 32 from chemicals used later in the process.

Figure 5B:
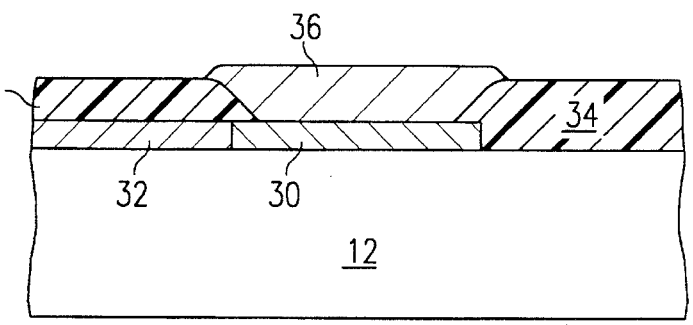

On passivation layer 34 and aluminum pad 30 is formed, using the process of Muller, see below, electroless nickel layer 36 as FIG. 5b shows. Without electroless nickel layer 36, direct contact between the gold compliant bump 10 metal and aluminum pad 30 could result in the formation of undesirable intermetallics. It also protects aluminum pad 30 from chemicals used later in the process.

Zincate activation, followed by electroless nickel plating is a way of putting nickel over aluminum to protect aluminum pad 30. Gold reacts with aluminum to form brittle intermetallics that can make the aluminum pad an unreliable electrical connection path. To overcome this problem, the present embodiment applies nickel layer 36 over aluminum pad 30 using a process called zincating. J. Simon, et al., "Electroless Bumping for TAB and Flip Chip," *Proc. 1993 Int'l Symp. on Microelectronics*, 439–44 (November 1993) (hereinafter Simon), defines a diluted zincating solution that may be useful for this application. A. Osterman, "The Pretreatment of Aluminum Bondpads for Electroless Nickel Bumping," *IEEE*, 74–78 (1993) (hereinafter Osterman), in addition, refers generally to the use of a commercial zincate solution for this purpose. Simon and Osterman are herein expressly incorporated by reference for all purposes applicable to practicing the present invention.

U.S. Patent Application [MCC Docket No. D-5570], by H. G. Muller, entitled "An Electroless Method of Zincating An Aluminum Surface," and assigned to Microelectronics and Computer Technology Corporation (MCC), (hereinafter the application shall be referred to as Muller) describes a method using successful zincating solutions for this process essentially based on the ratio of hydroxide concentrations to the zinc and iron group concentrations of tile solution. The process of Muller includes a zincating step, preferably double zincating steps, for removing the oxide layer from the aluminum, followed by an electroless nickel deposition step. An important feature of Muller is the use of a specific concentrations of the zincating solution and, in particular, the use of from about 12 to 30 g/l of NaOH, in an amount lower than other processes. Muller is herein expressly incorporated by reference for all purposes applicable to practicing the present invention.

Figure 5C:
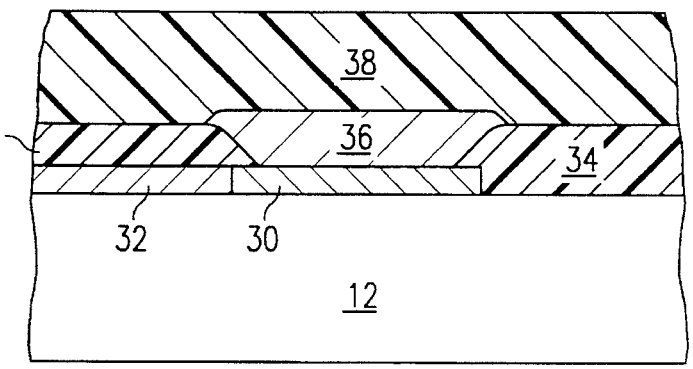
Figure 5D:
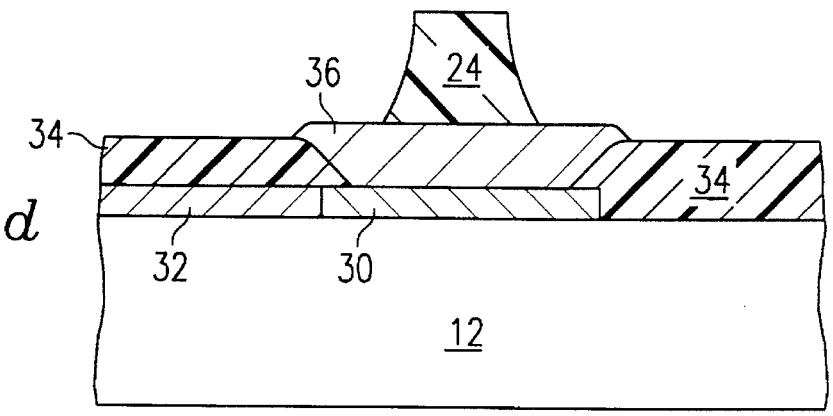

FIG. 5c shows the results of the next step of applying photo-imageable polyimide layer 38. Polyimide layer 38 covers electroless nickel layer 36 and passivation layer 34. Photo-imageable polyimide layer 38 is then patterned and etched to form polymer bump 24; see FIG. 5d.

On the other hand, a photo-tool may be used to allow ultraviolet exposure of the desired polymer bump 24 area, and then expose, develop, and cure polymer bump 24. Polymer bump 24 is preferably slightly smaller than the bond pad opening in the integrated circuit chip passivation layer. This permits top surface 14 metal to make contact with the electroless nickel surface surrounding polymer bump 24.

Figure 5E:
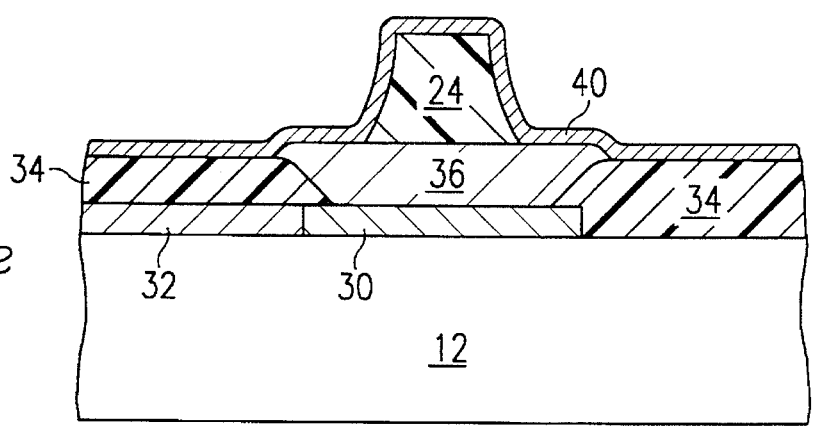

FIG. 5e shows the next steps of sputtering metal layer 40 on polymer bump 24, nickel layer 36, and passivation layer 34. Layer 40 includes first a titanium layer, then a gold layer followed by further titanium layer. In one embodiment, for example, layer 40 includes a 700 Å titanium layer, followed by a 2500 Å gold layer, further followed by 700 Å titanium layer.

Figure 5F:
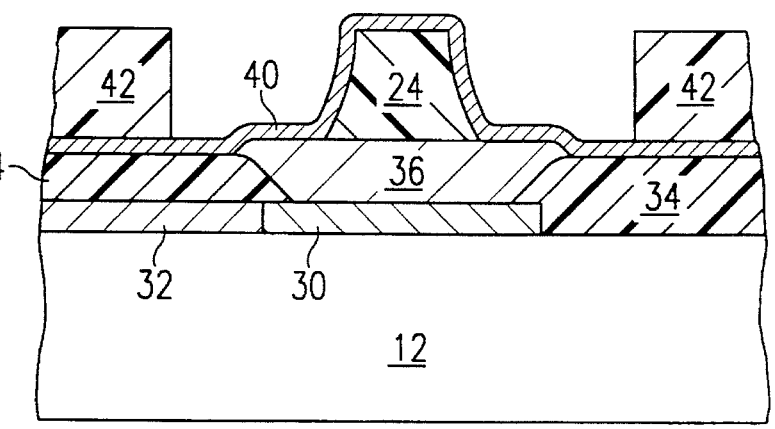
Figure 5G:
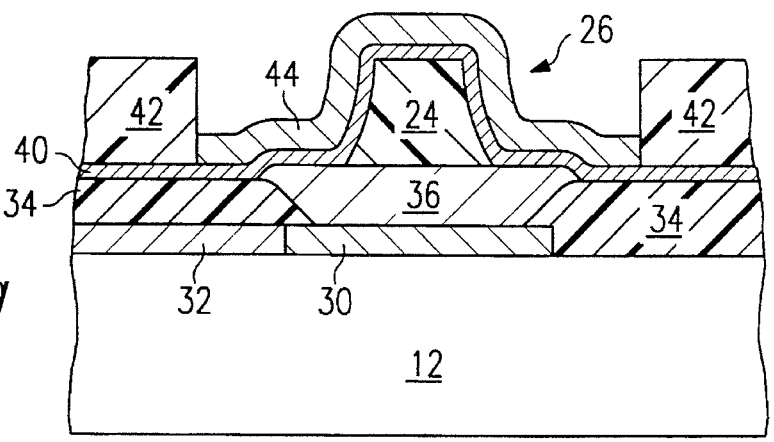
Figure 5H:
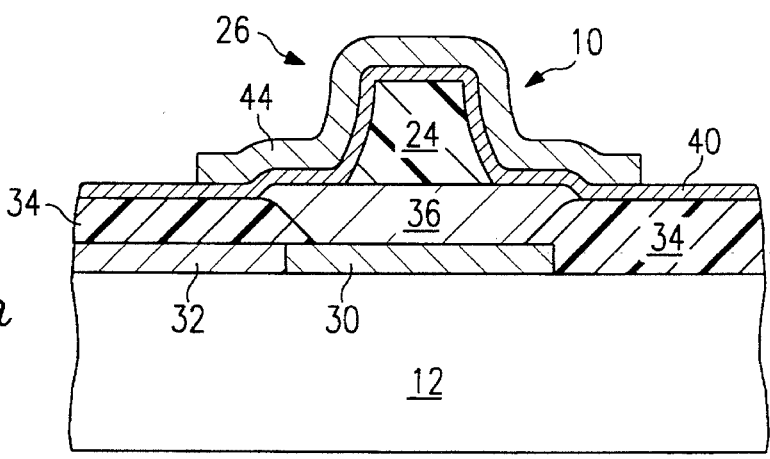

FIG. 5f shows the next step in the current process. On layer 40, patterned photo-resist layer 42 is applied. Photo-resist layer 42 openings should be at least as large as the original chip passivation openings for the bond pad on the integrated circuit chip. The top titanium layer is removed to expose clean, sputtered gold. Gold layer 44 is then electroplated, as FIG. 5g illustrates, on that portion of layer 40 not covered by photo-resist layer 42. In the present embodiment, gold layer 44 is electroplated to a thickness of approximately 2 µm. Photo-resist layer 42 is then removed to expose layer 40, as FIG. 5h shows.

A subtractive approach that uses sputter or evaporation deposition may also form metallization layer 26 on polymer bump 24. A subtractive process consists of depositing metal over the entire substrate and polymer bump surface of IC chip 12 to a desired thickness by evaporation or sputtering. A next step is to apply an etch mask over what will become compliant bump 10 and etch away the field metal. A subtractive technique has few steps and can be done with equipment available in a typical integrated circuit manufacturing facility. However, this is a costly method because the metal thicknesses required result in lengthy evaporator cycles and most of the metal consumed in the vacuum deposition process is etched away.

Figure 5I:
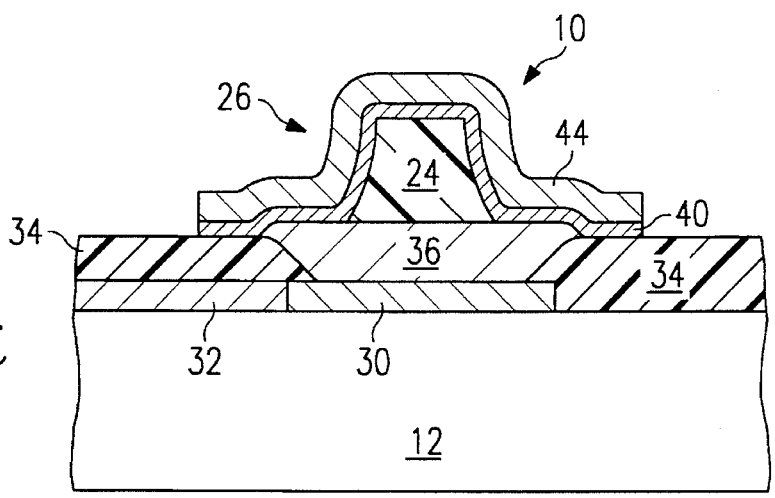

FIG. 5i shows the removal of layer 40 to finally expose passivation layer 34 and the resulting compliant bump 10 only. In this final step, titanium is etched from the open areas, then sputtered gold that is not covered by the electroplated gold is also etched. Then the bottom layer of titanium is etched away. A small fraction of the electroplated gold is removed as well, but the majority remains. To etch away layer 40 either different etchants may be used to selectively etch titanium and then gold, and then titanium, or one etchant may be used that minimally affects the gold of layer 40.

Figure 6A:
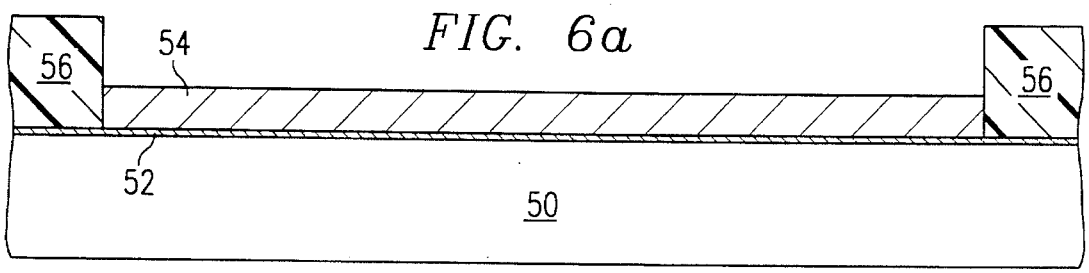
FIGS. 6a through 6h illustrate one process flow for forming a compliant bump according to the present embodiment.
Figure 6B:
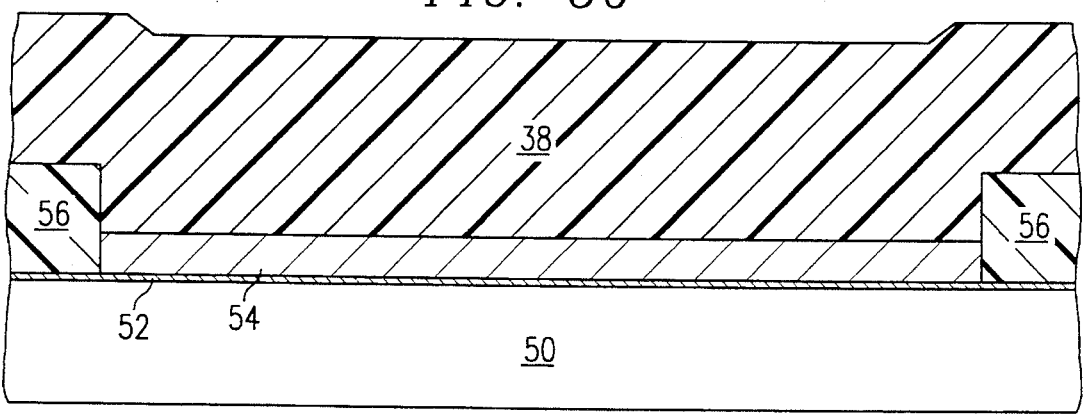
Figure 6C:
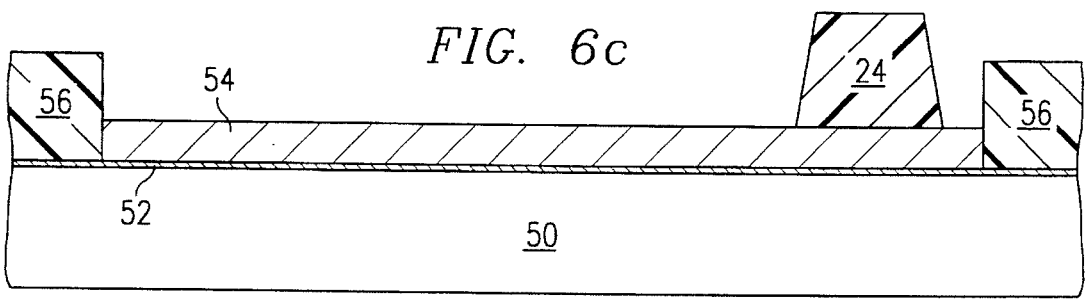

FIGS. 6a–6h provide an exemplary process flow to illustrate how to perform the photo-imageable process of the present embodiment in conjunction with fabrication of substrate conductors so as to eliminate need for chip bumping entirely. Referring to FIG. 6a, on substrate 50 is first applied plating interconnect 52. The next step is to apply photo-resist layer 56 to define the conductor pattern. Copper trace layer 54 is applied next, as FIG. 6a shows. Copper trace layer 54 forms both the trace and bond pad for substrate 50. After copper trace layer 54 is applied, photo-imageable polymer layer 38 is applied as FIG. 6b illustrates. The photo-pattern is then applied so that all of photo-imageable polymer layer 38 is removed except for polymer bump 24. Polymer bump 24 attaches to copper trace layer 54, as FIG. 6c shows. The photo-pattern for photo-imageable polymer layer 38 controls the specific diameter for polymer bump 24. A practical minimum diameter is approximately 25 µm. This minimizes the possibility of bump non-plating or damage in routine handling. However, even much smaller diameters may be achievable using a photo-imaging polyimide processes. Bump patterns as small as 10 µm in diameter may be formed if necessary.

Most photo-imageable polymers also shrink up to 50% during cure. This results in a slight disk shape or concavity on top surface 14 (see FIG. 1). In the bonding process, however, top surface 14 conforms to the topography of the mating surface.

Although FIGS. 6a through 6c show the use of a photo-imageable epoxy to form polymer bump 24, plasma etch processing is another possible process for this purpose. In plasma etch processing, the polymer material is coated on substrate 50 and then cured. An etch mask defines the etch pattern. The etch mask material may be an erodible mask made of photoresist or a metal hard mask that is patterned either by photolithography or wet etching. After the etch mask is imaged, the material is etched and the bumps are formed.

There are advantages and disadvantages to dry etch processing to form polymer bump 24. One advantage of dry etch that the polymer bump 24 profile that forms side portion 16 may be modified by adjusting process parameters. One problem of this approach, on the other hand, is that a large aspect ratio is difficult to achieve in this process. This is due to a high degree of undercut that arises with hard mask dry etch processes when etching very thick films of material. Etch rates for polymer dry etch processes are 0.5 to 2.0 μm per minute. So, for thick films, the etch process is lengthy, expensive, and throughput is low.

Wet etch processing of the polymer is similar to dry etch processing and provides yet a second alternative to the photo-imageable processing of FIGS. 6a through 6c. With wet etch processing, a wet chemical etch defines the etch pattern instead of a dry plasma. The material is coated on substrate 50 and partially cured. Photo-resist is then coated over the polymer, exposed, and developed. The photo-resist forms the etch mask. The polymer is then etched and the bumps formed.

Advantages to this approach relative to dry etch processing are that costly etching equipment is generally unnecessary and few steps are necessary to complete the process. Chip geometry, however, may limit this approach. In addition, very large aspect ratios using this approach are difficult to fabricate. Another limitation of wet etch processing is that the profile of side portion 16 is not easily modified with wet etch materials. Bump height uniformity, on the other hand, is very good with this approach.

Figure 6D:
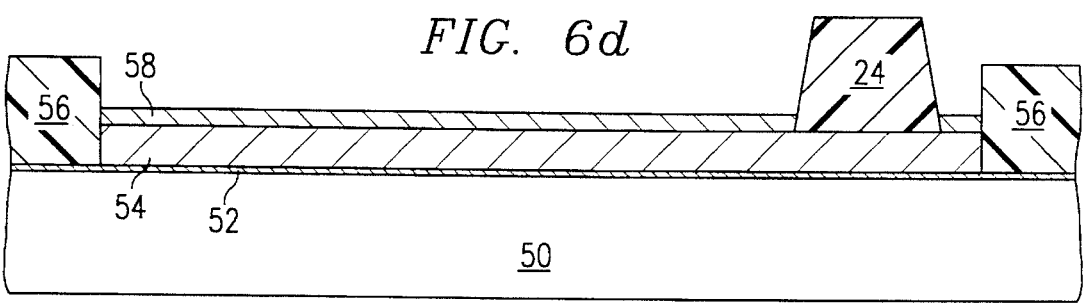

FIG. 6d shows the results from the next step of electroplating nickel layer 58 on copper layer 54. Note that because polymer bump 24 is non-conductive, no nickel plates to it. Nickel layer 58 is electroplated on all exposed copper surfaces to a thickness of between 2 μm and 8 μm in the present embodiment. This is appropriate for wire bonding or soldering for non-flip chip components.

For the present embodiment, several processing options are available for forming metallization layer 26 on polymer bump 24. Metallization of polymer bump 24 may be done by a direct wet metallization process using conventional PCB techniques, subtractive metallization using sputter or evaporation deposition, or an additive process using a sputtered or evaporated plating buss with a plating mask.

Figure 6E:
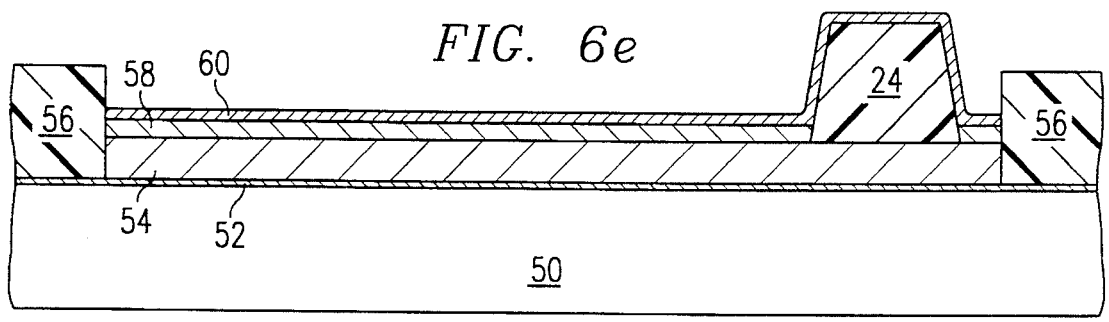

FIG. 6e shows the result of the preferred process of electrolessly forming layer 60 of electroless gold on nickel layer 54 and polymer bump 24. The particular photo-resist in the present embodiment is chosen to resist activation. As a result, electroless gold only plates to the electroplated nickel 54 and polymer bump 24. Another possible technique for performing the step of FIG. 6e is to mix a catalytic powder with polymer before it is coated and the bump is formed. This powder would initiate electroless plating as a means for metallization.

An additive electroplating process may also be used to metallize polymer bump 24. An electrolytic plating approach requires that a thin (typically gold for compliancy) plating buss be deposited, typically sputtered, and a plating mask applied to define the desired areas to be plated. After electroplating in the desired areas, the plating mask and the plating buss are removed. This additive process using electroplating could be done using equipment that is commonly used in the PCB industry. This method is more cost effective than pattern etching because the evaporator or sputter cycles are short, and very little material is etched, and therefore lost, in the final etch process. The preferred embodiment, therefore, uses the electroplating process in conjunction with electroless deposition of metal layer 40.

Figure 6F:
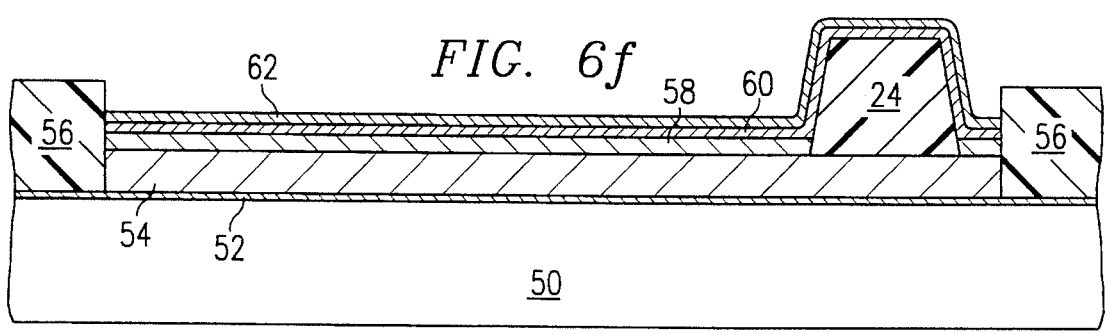

FIG. 6f shows the results of the next step of electroplating gold layer 62. Gold is electroplated to form layer 62, using a commercially available bath, to a thickness desired for wire bonding at a current density of approximately 8 amps per square foot, depending on the application. The combination of gold layer 62 and layer 60 form metallization layer 26 of FIGS. 2 through 4. Note that the plating rate on polymer bump 24 will be four to six times slower than the plating rate on the flat or bond pad portion of layer 60. This is because of the different conductivity of the thick copper-nickel-gold pads and traces compared to the thin gold on polymer bump 24. Consequently, metallization layer 26 may be between approximately 0.5 μm and 0.8 μm on polymer bump 24 when its thickness is approximately 3.0 μm elsewhere. It is possible, therefore, to optimize the gold thicknesses for a mixed technology assembly, while at the same time maintaining the thin layer on polymer bump 24 that is necessary for compliancy. In the present embodiment, for example, metallization layer 26 is selected to be sufficiently thick to provide electrical connectivity from substrate bond pad 20 to the top surface 14 (FIG. 1), while, at the same time to be sufficiently thin so as not to offset the compliancy and flexibility of polymer bump 24.

As stated above, steps other than those of FIGS. 6d through 6f may be taken to form metallization layer 26. One alternative, for example, is a wet metallization process. In direct wet metallization, standard techniques of the PCB industry apply. The process may consist of applying a plating catalyst to polymer bump 24 and electrolessly plating a ductile material such as gold onto polymer bump 24 and nickel layer 54. Wet metallization processes permit high throughput of parts and do not require a vacuum fabrication step.

Figure 6G:
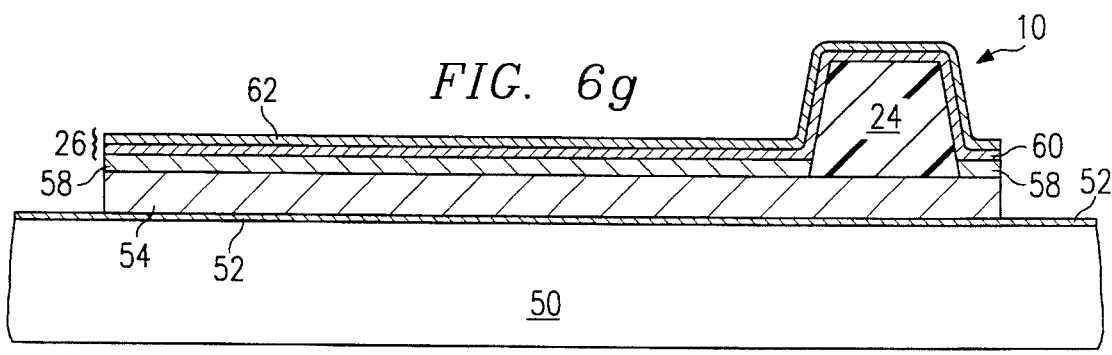
Figure 6H:
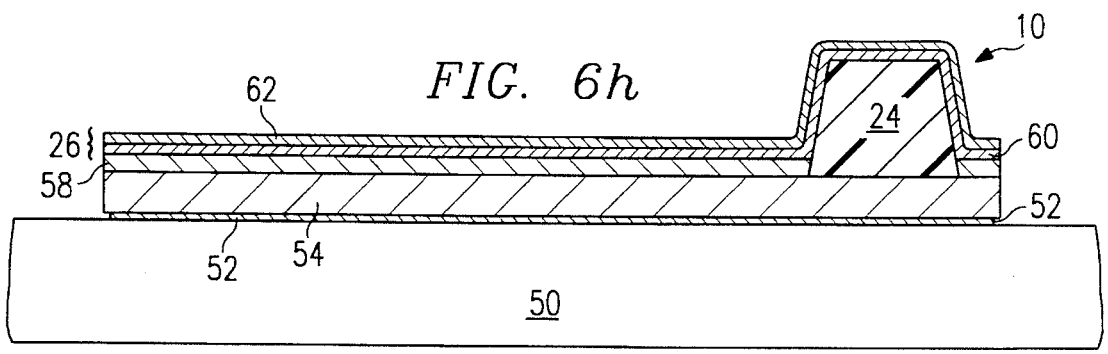

FIGS. 6g and 6h finish the structure of the present embodiment. Thus, FIG. 6g shows the step of stripping off photo-resist layer 56. The result is compliant bump 10 that has metallization layer 26 over polymer bump 24 both of which cover bond pad 20. In the next step that FIG. 6h shows, plating interconnect layer 52 is etched back in a manner routine in the processing of additive-process substrates to beneath copper trace layer 56. The result is the exposure of substrate 12 and some degree of undercut to produce indented regions.

Figure 7A:
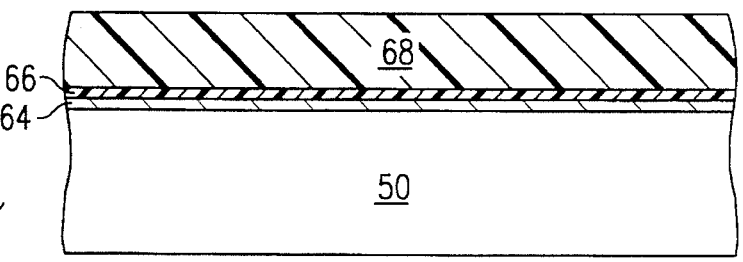
FIGS. 7a through 7l illustrate a two-layer masking process that forms yet another embodiment of the present invention.

FIGS. 7a through 7l show the use of a dual-resist process for forming a nickel coating on the sidewalls of signal line 72 and bond pad 74. Referring to FIG. 7a, on substrate 12 plating interconnect 64 is first deposited. On plating interconnect 64 is spun a B-stage cured polyamic acid or polyimide layer 66 and then photo-resist layer 68.

Figure 7B:
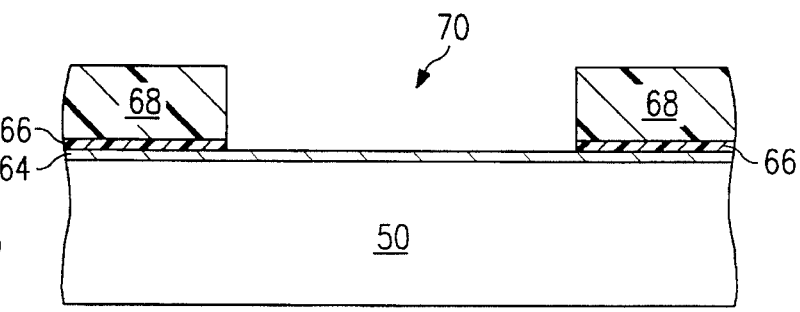

Photo-resist layer 68 is then patterned, as FIG. 7b shows, to form opening 70 that goes through photo-resist layer 68, B-stage cured polyimide layer 66 down to expose plating interconnect 64 in a desired pattern. Sacrificial B-stage polyimide layer 66 is not photo-sensitive, but is soluble in the resist developer. It, therefore, is removed in this step. Note, however, that generally after photo-patterning, post baking occurs.

Figure 7C:
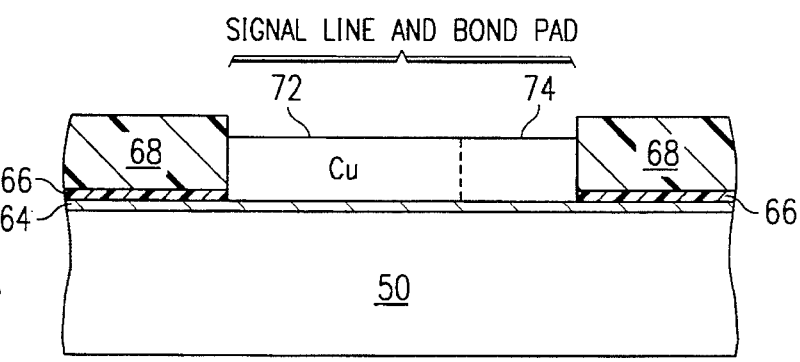
Figure 7D:
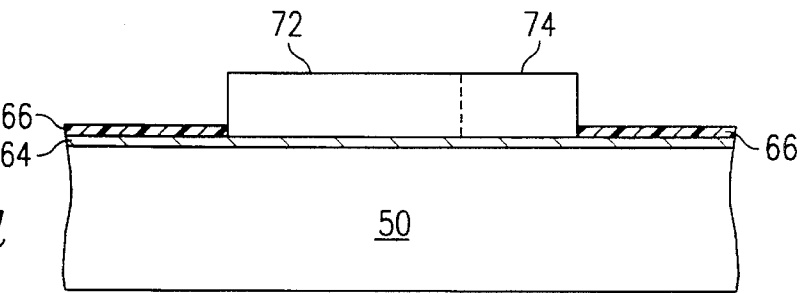

The pattern of opening 70 matches the desired bond pads and signal lines for the electronic circuit device. After photo-imaging and developing, the substrate is "post-baked." This completes curing of the photo resist and the polyamic acid (or polyimide) layer 66. After this post-bake, the thin polyamic acid (or polyimide) layer 66 is no longer soluble in photoresist 68 stripper. FIG. 7c, therefore, shows that within opening 70 may be formed copper signal line 72 and bond pad 74. Photoresist layer 68 is then removed, as FIG. 7d shows.

Figure 7E:
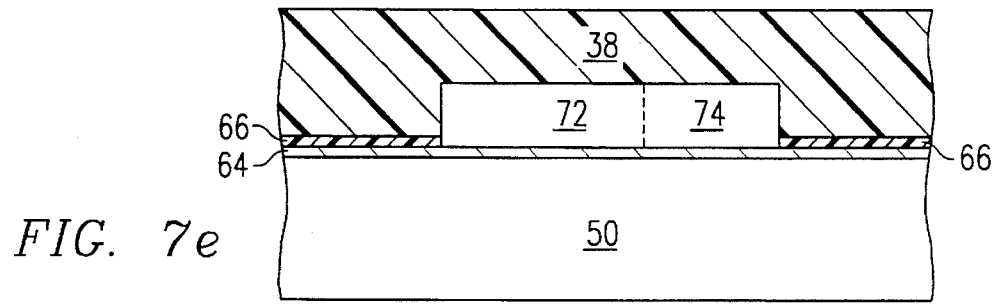
Figure 7F:
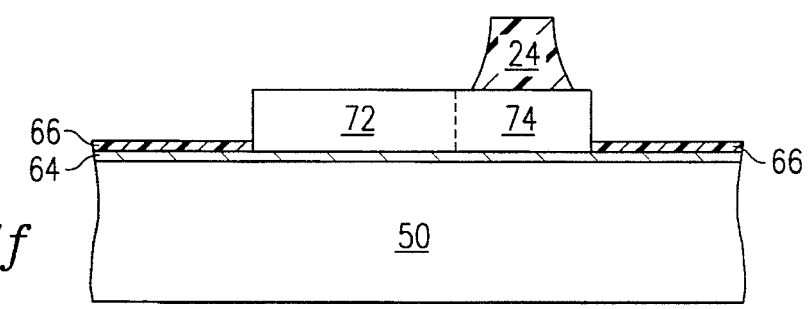
Figure 7G:
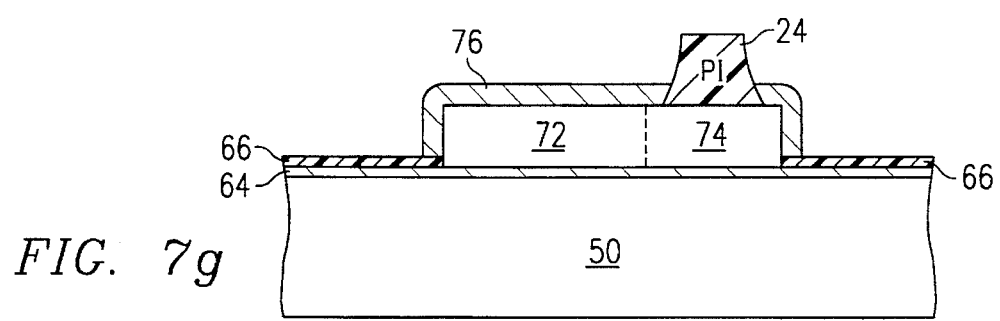

Polymer bump 24 is then formed as described and as FIGS. 7e and 7f show. The polymer layer for this embodiment may be preferably photoimageable polyimide or wet-etchable polyimide. Referring to FIG. 7g, nickel is then electroplated on copper signal line 72 and that portion of bond pad 74 not covered by polymer bump 24 to form barrier layer 76. Barrier layer 76 is desirable for for applications requiring surface mount soldering or wirebonding of adjacent parts. Note that barrier layer 76 does not plate on polymer bump 24 because polyimide is not conductive.

Figure 7H:
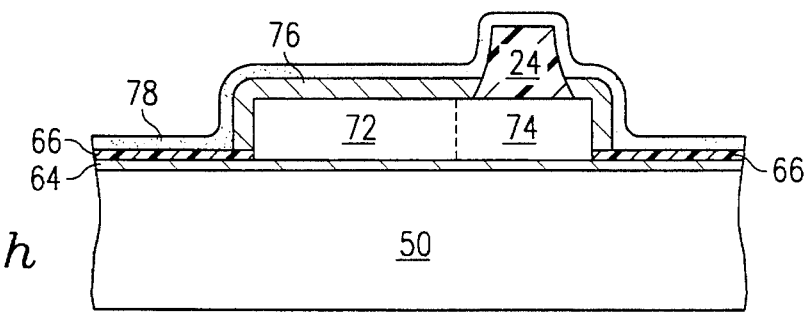
Figure 7I:
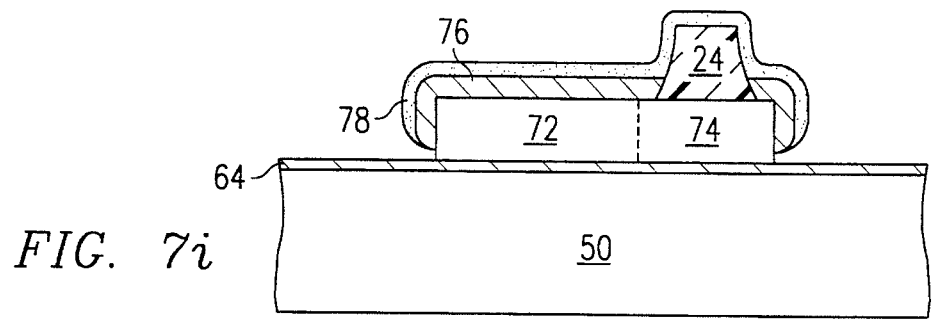

The next step is to catalyze barrier layer 76 and polymer bump 24, as FIG. 7h illustrates. Then B-stage polyimide layer 66 is removed, FIG. 7i, from all parts of the device. This removes all catalyst except for the portion covering barrier layer 76 and polymer bump 24. Gold is then electrolessly plated on barrier layer 76 and polymer bump 24 using catalyst 78 to form electrolessly plated layer 80.

Figure 7J:
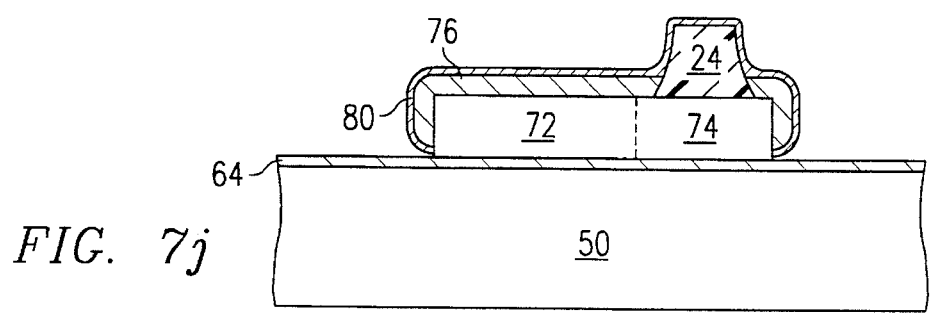
Figure 7K:
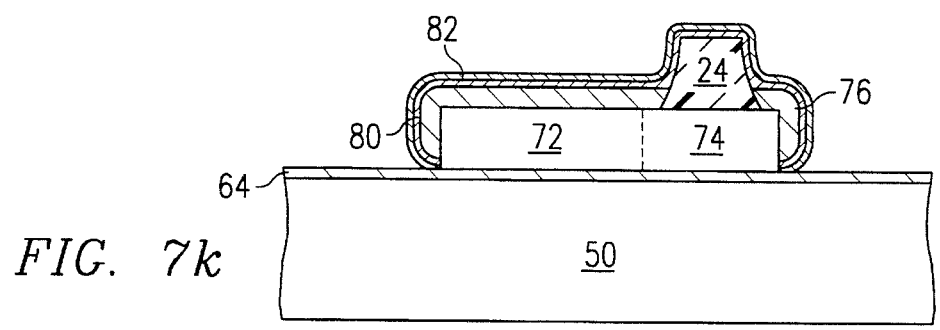
Figure 7L:
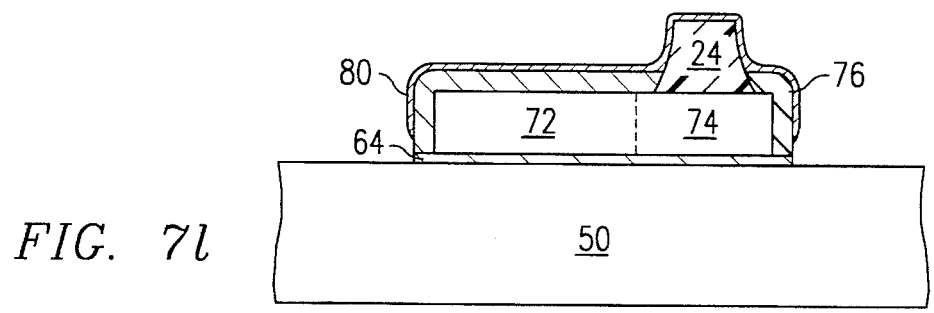

FIG. 7j shows the results of this step. Note for applications involving both flip-chip devices as well as one involving both flip chip and surface mount technology, it is desirable to plate gold to a thickness of 2 microns and remove plating interconnect 64, see FIG. 7l, to complete the compliant bump formation. On the other hand, for an assembly using both flip chip and wirebonded devices, it is preferable to plate electrolessly gold to approximately 100 Angstroms, and then electroplate gold as FIG. 7k depicts. In devices using both flip chip and wirebonding, gold will plate faster on signal line 72 and bond pad 74 than on polymer bump 24 due to the higher resistance of the 100 Angstroms gold on polymer bump 24. After electrolytically plating gold on electrolessly plated gold layer 80, plating interconnect 64 is removed.

Figure 8:
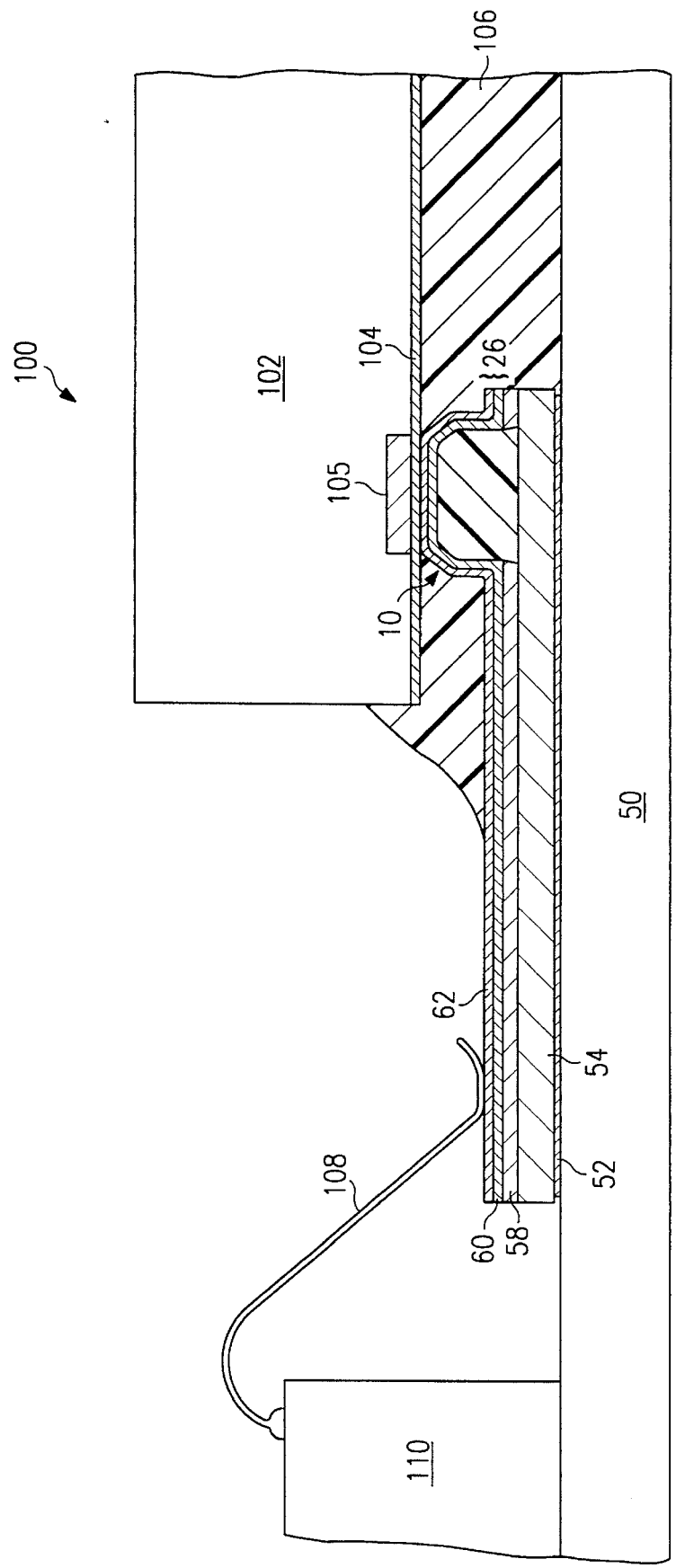
FIG. 8 illustrates a hybrid assembly that uses the present invention.
Figure 9A:
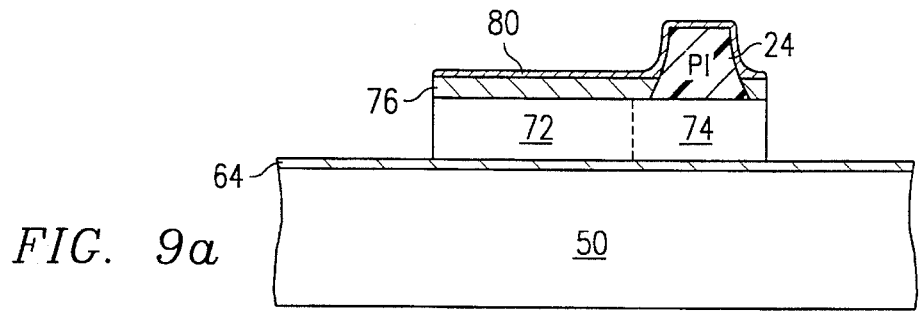
FIGS. 9a through 9d depict another process flow for enhancing the material properties of the compliant bump of the present invention.
Figure 9B:
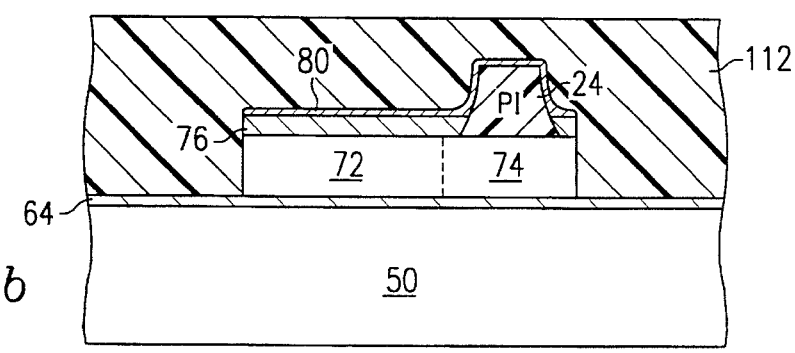
Figure 9C:
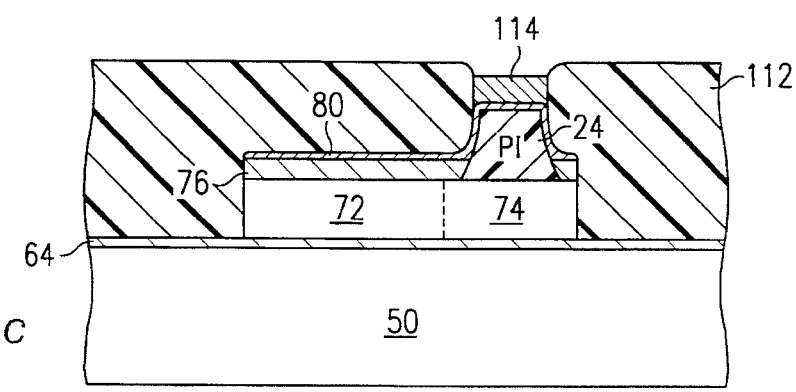
Figure 9D:
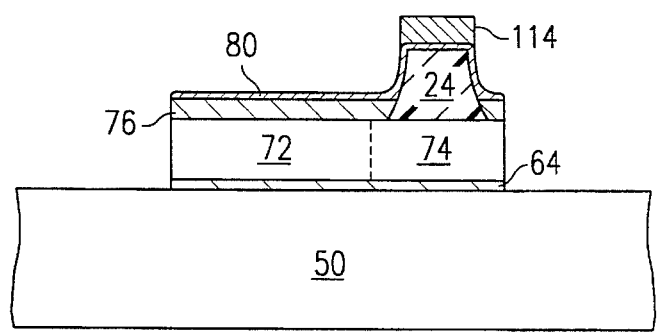

FIG. 8 shows assembly 100 that is formed according to the present embodiment and that includes flip chip 102. Flip chip 102 connects via connection trace 104 to compliant bump 10. Adhesive 106 is non-conductive and holds flip chip 102 in compressive contact with compliant bump 10. Adhesive 102 is preferably dispensed on the finished substrate bonding site in a pattern which facilitates even flow to the edges of the die with a small amount being extruded during the bonding cycle. Adhesive 102 may be patterned or selectively dispensed so as not to fully cover compliant bump 10 and connection trace 104. Adhesive 106 may be a thermoplastic, thermoset plastic, or other adhesive formulation. For example, adhesive 106 may be a thermoplastic paste which is a mixture of thermoplastic particles and a volatile fluid that may contain alumina, aluminum nitride, diamond or other particles for enhanced thermal conductivity. Connecting to metallization layer 26 of compliant bump 10 is bond wire 108. Bond wire 108 connects to wire bonded chip 110. Wire bonded chip 110, therefore, connects through compliant bump 10 to flip chip 102.

Note that while it is not necessary to practice the invention, in the present embodiment the coefficient of thermal expansion (CTE) of compliant bump 10 may be made equal to that of the thermoplastic adhesive by carefully controlling the thickness of metallization layer 26 and polymer bump 24. It is not necessary that the CTE of polymer bump 24 and metallization layer 26 be equal, because polymer bump 24 is sufficiently compliant to overcome a mismatch in the expansion rate of metallization layer 26.

In forming assembly 100, substrate 12 and flip chip 102 are placed on a suitable flip chip bonder with flip chip 102 on the bonding thermode and substrate 12, which includes compliant bumps 10 and adhesive 106, on the bonder platen. Bond pad 105 is aligned to the compliant bump 10, and the platen tilt may be adjusted to ensure that flip chip 102 and substrate 12 are parallel. Flip chip 102 is then pressed into contact with the numerous compliant bumps 10 on substrate 12. Flip chip 102 is then pressed into contact with sufficient force to deform compliant bumps 10 to a predetermined degree. During this process, it may be necessary to apply heat to render adhesive 106 semi-liquid so as to facilitate its displacement. Additional application of heat or ultraviolet energy cures adhesive 106. Alternatively, in the case of adhesive 106 being a thermoplastic, removal of heat causes adhesive 106 to harden.

The force that forms assembly 100 places compliant bump 10 under a compressive load. Additionally, shrinkage of adhesive 106 may occur during curing or subsequent cooling. The compressive load and shrinkage ensures that flip chip 102 electrodes remain in contact with compliant bumps 10. The applied pressure is a function of the total flip chip bump 10 top surface area for all the bumps on a chip. In one implementation, good results were obtained when the applied force equaled the total bump surface area of flip chip 102 in square inches multiplied by 20,000 psi. In curing adhesive 106, heat may also be applied to evaporate any volatile fluid constituent of the associated thermoplastic paste. In applying heat to adhesive 106, it is also important to keep the heat at a level sufficiently low that it does not boil. This is because boiling creates voids in the adhesive bond line that can cause assembly 100 to-fail. For example, in the present embodiment the temperature of assembly 100 is increased to a level sufficiently high to melt the thermoplastic, i.e., to a temperature approximately 250° C. Assembly 100 is then allowed to cool to 90° to 100° C. before the bond pressure is withdrawn. Withdrawing the bond pressure completes the assembly 100 fabrication process.

In forming assembly 100 of FIG. 8, the modulus of elasticity for adhesive 106 should exceed that of compliant bump 10 over a reasonably well-defined range of temperatures. Since the modulus of a thermoplastic generally decreases at temperatures higher than the associated glass transition temperature, $T_g$, and polymer bump 24 preferably has $T_g$ values ranging from 70° to 125° C., the thermoplastics that assembly 100 should use preferably have a $T_g$ not less than that of the maximum application temperatures of the final assemblies of the products. For example, a semi-crystalline thermoplastic that serves as adhesive 106 should have a $T_g$ of at least 65° to 75° C. Likewise, an amorphous thermoplastic that serves as adhesive 106 should have a 150° C. $T_g$. More particularly, semi-crystalline thermoplastics that may serve as adhesive 106 include PBT, PET, Nylon-6, Nylon-6/6, Nylon-6/12, Nylon-12, and polyetherketones. These adhesives possess $T_g$ values of from 65° to 140° C. with $T_m$ values ranging from 185° to 310° C., depending on the adhesion crystallinity. Amorphous thermoplastics that work well for adhesive 106 include polystyrene, polyethermides, polyethersulfones, and polyimidesiloxanes, which possess $T_g$ values ranging from 125° to 150° C.

Although numerous compounds and substitutions may be made to form the configurations of FIGS. 5a though 8, the following Table 1 lists manufacturers, part numbers, specific compounds, and approximate thicknesses of one implementation of the present embodiment.

TABLE 1

| Component | Thickness | Manufacturer/ Description |
|---|---|---|
| 1. Photoimageable polymer (38) | 30 μm | Shipley XP91-111 |
| 2. Nickel layer (36, 76) | 2–8 μm | Shipley |
| 3. Activator | — | Shipley 404 |
| 4. Catalyst (78) | — | Shipley 44 |
| 5. Accelerator | — | Shipley 19 |
| 6. Electroless gold (60, 80) (or titanium or palladium) | 0.5 μm | Shipley __ |
| 7. Electroplated Gold (44, 62, 82) | BA Current Density | Sel-Rex or Learo Aural Potassium-Gold Cyanide |
| 8. Adhesive (106) | — | Staystick 301- unfilled or Staystick 201- alumina filled |

FIG. 9 shows one process for improving the material properties of compliant bump 10 without adversely affecting its compliancy. The process of FIG. 9 assumes a compliant bump 10 formed according to any of the aforementioned processes. With compliant bump 10, the process of FIG. 9 applies photoresist layer 112 whose thickness exceeds the total height of compliant bump 10. Photoresist layer 112 may be patterned so as to expose only top surface 14 of compliant bump 10. The next step is to further electroplate a second metal layer 114 onto top surface 14. It may be desirable to chose second metal layer 114, for example, as a highly abrasion resistant or hard metal for applications where there is going to multiple contact or insertions made such a test or burn in contacting system.

After electroplating second metal layer 114, the process further entails stripping away photoresist layer 112. The last step is to strip the plating interconnect layer 52, which was there from the fabrication process for compliant bump 10, itself. The result is a compliant bump 10 having enhanced material properties on top surface 14. Note that if no plating interconnect 52 is present (e.g., if the prior compliant bump 10 process used and electroless metallization process), second metal layer 114 can also be electrolessly plated. This, however, restricts material selection to materials such as high phosphor electroless golds, for example, which are very hard and suitable for test and burn-in contacts.

Figure 10:
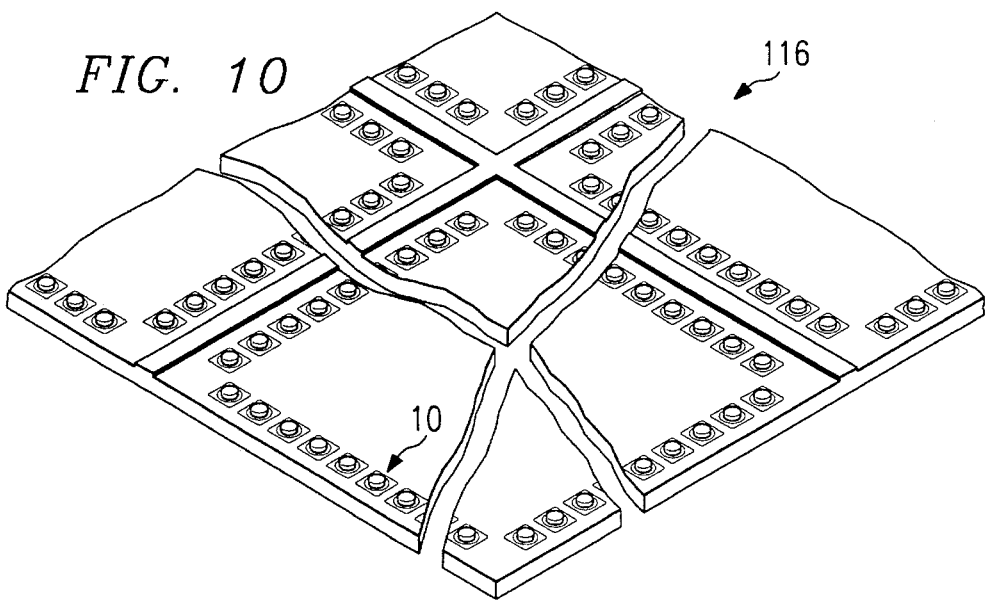
FIG. 10 shows numerous compliant bumps formed according to the present embodiment on a silicon test chip wafer.

Having described the component parts and various methods of forming compliant bump 10, it is useful to understand how the present embodiment may be arranged together with an integrated circuit chip. For this purpose, FIG. 10 shows numerous compliant bumps 10 formed on silicon test chip wafer 116. In the FIG. 10 configuration, compliant bumps 10 are fabricated on a 216 input/output, 150 μm pitch silicon test wafer. In fact, FIG. 10 shows part of a 60-chip test wafer 116 that assists in determining electrical and physical properties of compliant bump 10 of the present embodiment. Test chip 116 of FIG. 10, in one implementation, was an 8.9 mm by 8.9 mm chip having 216 input/output compliant bumps 10 connected in a dual nested daisy chain pattern. This configuration allows continuity checking of these connections with two resistance measurements, each reading through 105 connections. Adjacent bump electrical isolation is determined by measuring the resistance between the two daisy chains. In the 216 input/output connections, six of the chip pads connect to a triple-track feature that permits surface insulation resistance and electro-migration testing. These six chip pads can also be used for thermal testing by biasing two of the tracks as heating elements (for a total of 25 watts per chip) and using the center track as a thermistor. The substrate used in this testing was display quality borosilicate glass, sputtered with chrome-gold and patterned with a known substrate design that complements the chip features.

Figure 11:
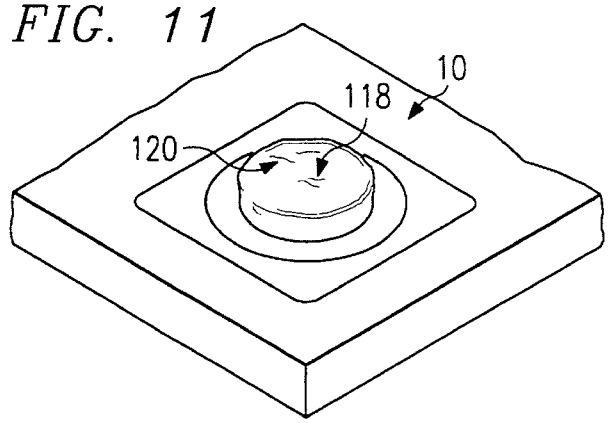
FIG. 11 illustrates a compliant bump of the present embodiment after 3000 mechanical cycles from 20 kpsi to 70 kpsi loading.

FIG. 11 illustrates the resiliency of compliant bump 10. In one test using the FIG. 10 test wafer, compliant bump 10 was mechanically cycled using a flip chip bonder device. The test included 1000 cycles using compression ranges between 20 and 70 lbf (i.e., equal to approximately 20 kpsi to 70 kpsi over the total bump area). Examination following this test revealed a reduction in the free-standing bump height of approximately 50%. No cracks, however, were present in either metallization layer 26 or polymer bump 24. After 3000 mechanical cycles, small cracks such as cracks 118 and 120 appeared. Even at this point, however, compliant bumps 10 remained conductive and compliant.

Figure 12:
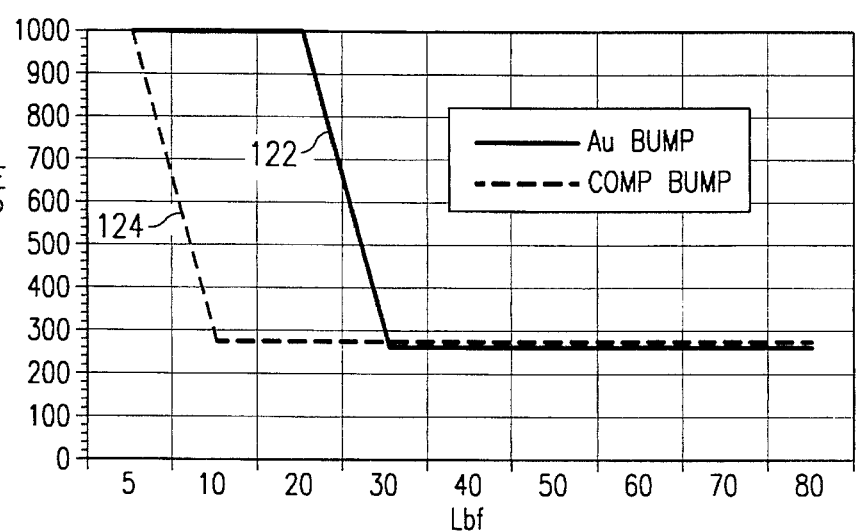
FIG. 12 illustrates resistance test results of the test device of FIG. 10 relative to resistance test results of a test device that has conventionally formed solid metal bumps.

Another important aspect of the present embodiment is how it performs during dry cycling testing i.e., without an adhesive such as adhesive 106 of FIG. 8. FIG. 12 describes results of one test that examines this property. In the FIG. 12 test, chips with solid gold bumps and chips with compliant bumps were aligned to a complementing structure (i.e., soda-lime glass with chrome and gold sputtered metal pads and traces) and pressed down without adhesive 106 using varying amounts of force. The device used for the test was similar to the daisy chain structure of FIG. 10. The test determines what applied force (Lbf) establishes electrical contact and the force beyond which contact resistance (Ω) stabilizes. This is an indication of the ability of the bumps to counteract non-planarity in the system.

As FIG. 12 illustrates, the compliant bumps establish contact at approximately one-fourth of the applied force required for contact with solid gold bumps. Both bump systems achieved similar resistances. The particular substrate metallurgy for the test vehicle having bumps 10 shows high resistance. Consequently, milliohm level differences and resistances were obscured by bulk resistance in the substrate.

In a high temperature test, compliant bump assemblies as in FIG. 4 and a comparable solid gold bump assemblies were operationally tested. Resistance through a daisy chain structure similar to that of FIG. 10 was monitored while assemblies were heated slowly to 140° C. All solid gold bump assemblies, failed between 65° C. and 80° C. Compliant bump 10 assemblies, on the other hand, withstood elevated temperatures until temperatures reached the 120° C. to 135° C. range. This range is well above the glass transition temperature of adhesive 106 in the present embodiment. Those compliant bump assemblies that lasted to 135° C. were assembled using identical force parameters. All compliant bump 10 assemblies returned to normal resistance levels after cooling to room temperatures. The tested gold solid metal bumps, to the contrary, had open circuits and failed to function properly after cooling to room temperature.

In yet another test of compliant bump 10 assemblies, both gold solid metal bump assemblies and compliant bump 10 assemblies in the FIG. 10 configuration were subjected to 121° C. at 100% relative humidity for two hours. Examination results following this period revealed that 50% of the solid metal bump assemblies failed, while only 12.5% of the compliant bump 10 assemblies failed. Thereafter, the complaint bump 10 assemblies were encapsulated with a commercially available silicone. The compliant bump 10 assemblies within the silicone encapsulant showed no further failures, even after eight more hours of 121° C. temperature at 100% relative humidity.

In still a further test of assemblies employing compliant bumps 10, rework was performed on several assemblies. The test devices were partially dipped in a solvent, making certain that the non-dipped compliant bump 10 assemblies were protected from solvent exposure. Solvent soak was successful at room temperature, and was determined to be acceleratable by raising the solvent temperature to approximately 80° C. Following the solvent dips, both substrate 50 and compliant bumped chip 12 emerged intact and reusable. In fact, some of the chips and substrate sites were reworked twice.

The present embodiment, therefore, provides compliant bump 10 on integrated circuit chips or on substrates so that no bumps or special metallurgy is needed on the die. This allows the use of the present embodiment on commercially available integrated circuit chips. Compliant bump 10 behaves compliantly over relatively large ranges of deformation and deforms at substantially lower pressures as well as requires lower reduced assembly forces than do solid metal bumps. Reducing the assembly forces also reduces the likelihood of damage to the integrated circuit chip, and further, reduces the demands on the adhesive material. This reduces the propensity of the adhesive to suffer creep-relaxation.

The elastic behavior of composite bump 10, moreover, ensures continued electrical contact even if the adhesive 50 does undergo creep-relaxation. This allows the use of adhesives with desirable reworkability and fast cure properties. The present embodiment, for example, even allows the use of adhesives that might not have sufficient strength and creep resistance in a circuit that uses solid metal bumps. For example, compliant bump 10 makes use of thermoplastics feasible. This prevents the need to cure adhesive 106 using heat or light energy, because thermoplastics are not cured by applying heat or light energy. Even further, the present embodiment allows optimal adhesive formulations that are independent of contact configuration and metallurgy.

Another important aspect of the present embodiment is its significant cost reduction relative to conventional solid metal bump forming techniques. Conventional solid metal bump forming techniques usually include sputtering a thin metal interconnect layer on a passivated substrate. The substrate or wafer is masked using photo-resist, and metal is electroplated into the photo-resist openings. Finally, the resist and metal interconnect are removed. This well-established process has a typical price for gold bumps on a four-inch wafer of approximately $150.00 per wafer in 1993 dollars. Compliant bumps 10 of the present embodiment, to the contrary, solve the problems of conventional solid metal bumping techniques at highly competitive costs. As a result, compliant bump 10 is suitable for a wide range of applications. The bumps can be manufactured with standard TAB bumping processes and equipment for less than $50 per four-inch wafer in 1993 dollars.

The process flow for forming compliant bump 10 allows for a more balanced or evenly distributed production process. As a result, in a typical fabrication reactor it is practical that the throughput for any step will be not less than fifteen wafers per hour. This makes production volumes in such a factory exceed 50,000 wafers per year before any duplicate equipment is necessary. A key factor that makes the present embodiment attractive is that the total number of process steps and associated capital equipment costs are much smaller than those that the standard solid metal bump forming processes use.

Compliant bumps 10 formed according to the present embodiment solve the z-axis movement problem associated with ultraviolet or heat curing adhesives that arise from CTE mismatches and moisture absorption. The present embodiment compliantly rebounds following compression to maintain electrical contact. Complaint bumps 10 also reduce the effect of bowed and twisted substrates as well as minimize the effect of irregular pad heights.

In some cases where a high level of performance and reliability is desirable, a maskless chip preparation process, which is fully compatible with the singulated integrated circuit die or with full wafers is possible. This process, for example, that of Muller, above, provides a nickel or gold layer on the integrated circuit chip aluminum bond pad so as to eliminate any direct contact between the gold bump metal and the aluminum integrated circuit chip metal. The present embodiment does not require substantial additional processing of the substrate, but utilizes techniques which are compatible with the processes used in fabricating substrate typical of flip-chip multi-chip module designs. The present embodiment permits multi-chip module and display manufacturers, therefore, to assess the size and performance benefits of adhesive flip-chip assembly technology several years sooner than if they use existing chip bump technology. This extends the usefulness of flip-chip technology to high-density chip-on-glass and other important applications.

Finally, although the present embodiments have been described in detail, it should be understood that various changes, substitutions and alterations can be made hereto without departing from the spirit and scope of the invention. Hence, while the preceding preferred embodiments are described for illustrative purposes and numerous substitutions will be apparent to those having skill in the art. As such, the invention shall be limited only by the scope of the appended claims.

What is claimed is:

1. A method for forming an electrically conductive compliant bump on a base having an electrical connector for compressively and compliantly connecting the electrical connector to an electrical connection point for an adhesive flip chip integrated circuit device, the method comprising the steps of:

forming a compressible polymer bump on a position of the electrical connector;

defining an area including the polymer bump on which to plate a ductile and compliant metal for covering the polymer bump and forming an electrical connection to the electrical connector; and plating a ductile and compliant metal layer over the polymer bump and a portion of the electrical connector to form a compressive and compliant electrical connection that is connectable between the electrical connector and the electrical connection point through compression and adhesion of an adhesive flip chip integrated circuit.

2. The method of claim 1, further comprising the step of forming the electrically conductive compliant bump on an integrated circuit wafer.

3. The method of claim 2, wherein the polymer bump forming step comprises the step of forming the polymer bump using a dry etch process.

4. The method of claim 3, further comprising the steps of:

depositing the ductile metal over the integrated circuit wafer;

forming a photoresist layer over the integrated circuit wafer for defining an area of the ductile metal layer covering the polymer bump and a portion of the ductile metal layer; and removing the remaining portion of the ductile metal layer.

5. The method of claim 3, wherein said defining step further comprises the steps of:

forming a thin conductive metal layer over the polymer bump and the integrated circuit wafer; and forming a photoresist layer over the thin conductive metal layer, the photoresist layer defining an area for exposing that portion of the thin conductive metal covering the polymer bump and at a portion of the electrical connector; and said plating step further comprises the step of plating the ductile metal over the defined area; and further comprising the steps
removing the photoresist layer to expose the remaining portion of the thin conductive metal layer; and
removing the remaining portion of the thin conductive metal layer.

6. The method of claim 3, wherein said defining step comprises the step of catalyzing said polymer bump to form a catalyzed polymer bump, and further wherein said plating step comprises the step of electrolessly plating said catalyzed polymer bump.

7. The method of claim 3, wherein said polymer bump comprises a polymer material having a pre-mixed catalyst, and further wherein said plating step comprises the step of electrolessly plating said polymer bump having said pre-mixed catalyst.

8. The method of claim 2, wherein the polymer bump forming step comprises the step of forming the polymer bump using a wet etch process.

9. The method of claim 8, further comprising the steps of:

depositing the ductile metal over the integrated circuit wafer;

forming a photoresist layer over the integrated circuit wafer for defining an area of the ductile metal layer covering the polymer bump and a portion of the ductile metal layer; and removing the remaining portion of the ductile metal layer.

10. The method of claim 8, wherein said defining step further comprises the steps of:

forming a thin conductive metal layer over the polymer bump and the integrated circuit wafer; and forming a photoresist layer over the thin conductive metal layer, the photoresist layer defining an area for exposing that portion of the thin conductive metal covering the polymer bump and at least a portion of the electrical connector; and said plating step further comprises the step of plating the ductile metal over the defined area; and further comprising the steps of:
removing the photoresist layer to expose the remaining portion of the thin conductive metal layer; and
removing the remaining portion of the thin conductive metal layer.

11. The method of claim 8, wherein said defining step comprises the step of catalyzing said polymer bump to form a catalyzed polymer bump, and further wherein said plating step comprises the step of electrolessly plating said catalyzed polymer bump.

12. The method of claim 8, wherein said polymer bump comprises a polymer material having a pre-mixed catalyst, and further wherein said plating step comprises the step of electrolessly plating said polymer bump having said pre-mixed catalyst.

13. The method of claim 2, wherein the polymer bump forming step comprises the step of forming the polymer bump from a photoimageable polymer.

14. The method of claim 13, further comprising the steps of:

depositing the ductile metal over the integrated circuit wafer;

forming a photoresist layer over the integrated circuit wafer for defining an area of the ductile metal layer covering the polymer bump and a portion of the ductile metal layer; and removing the remaining portion of the ductile metal layer.

15. The method of claim 13, wherein said defining step further comprises the steps of:

forming a thin conductive metal layer over the polymer bump and the integrated circuit wafer; and forming a photoresist layer over the thin conductive metal layer, the photoresist layer defining an area for exposing that portion of the thin conductive metal covering the polymer bump and at a portion of the electrical connector; and said plating step further comprises the step of plating the ductile metal over the defined area; and further comprising the steps of:
removing the photoresist layer to expose the remaining portion of the thin conductive metal layer; and
removing the remaining portion of the thin conductive metal layer.

16. The method of claim 13, wherein said defining step comprises the step of catalyzing said polymer bump to form a catalyzed polymer bump, and further wherein said plating step comprises the step of electrolessly plating said catalyzed polymer bump.

17. The method of claim 13, wherein said polymer bump comprises a polymer material having a pre-mixed catalyst, and further wherein said plating step comprises the step of electrolessly plating said polymer bump having said pre-mixed catalyst.

18. The method of claim 1, further comprising the step of forming the electrically conductive compliant bump on a substrate.

19. The method of claim 18, wherein the polymer bump forming step comprises the step of forming the polymer bump using a dry etch process.

20. The method of claim 19, further comprising the steps of:

depositing the ductile metal over the integrated circuit wafer;

forming a photoresist layer over the integrated circuit wafer for defining an area of the ductile metal layer covering the polymer bump and a portion of the ductile metal layer; and removing the remaining portion of the ductile metal layer.

21. The method of claim 19, wherein said defining step further comprises the steps of:

forming a thin conductive metal layer over the polymer bump and the integrated circuit wafer; and forming a photoresist layer over the thin conductive metal layer, the photoresist layer defining an area for exposing that portion of the thin conductive metal covering the polymer bump and at least a portion of the electrical connector; and said plating step further comprises the step of plating the ductile metal over the defined area; and further comprising the steps removing the photoresist layer to expose the remaining portion of the thin conductive metal layer; and removing the remaining portion of the thin conductive metal layer.

22. The method of claim 19, wherein said defining step comprises the step of catalyzing said polymer bump to form a catalyzed polymer bump, and further wherein said plating step comprises the step of electrolessly plating said catalyzed polymer bump.

23. The method of claim 19, wherein said polymer bump comprises a polymer material having a pre-mixed catalyst, and further wherein said plating step comprises the step of electrolessly plating said polymer bump having said pre-mixed catalyst.

24. The method of claim 18, wherein the polymer bump forming step comprises the step of forming the polymer bump using a wet etch process.

25. The method of claim 24, further comprising the steps of:

depositing the ductile metal over the integrated circuit wafer;

forming a photoresist layer over the integrated circuit wafer for defining an area of the ductile metal layer covering the polymer bump and a portion of the ductile metal layer; and removing the remaining portion of the ductile metal layer.

26. The method of claim 24, wherein said defining step further comprises the steps of:

forming a thin conductive metal layer over the polymer bump and the integrated circuit wafer; and forming a photoresist layer over the thin conductive metal layer, the photoresist layer defining an area for exposing that portion of the thin conductive metal covering the polymer bump and at least a portion of the electrical connector; and said plating step further comprises the step of plating the ductile metal over the defined area; and further comprising the steps of:

removing the photoresist layer to expose the remaining portion of the thin conductive metal layer; and removing the remaining portion of the thin conductive metal layer.

27. The method of claim 24, wherein said defining step comprises the step of catalyzing said polymer bump to form a catalyzed polymer bump, and further wherein said plating step comprises the step of electrolessly plating said catalyzed polymer bump.

28. The method of claim 24, wherein said polymer bump comprises a polymer material having a pre-mixed catalyst, and further wherein said plating step comprises the step of electrolessly plating said polymer bump having said pre-mixed catalyst.

29. The method of claim 18, wherein the polymer bump forming step comprises the step of forming the polymer bump from a photoimageable polymer.

30. The method of claim 29, further comprising the steps of:

depositing the ductile metal over the integrated circuit wafer;

forming a photoresist layer over the integrated circuit wafer for defining an area of the ductile metal layer covering the polymer bump and a portion of the ductile metal layer; and removing the remaining portion of the ductile metal layer.

31. The method of claim 29, wherein said defining step further comprises the steps of:

forming a thin conductive metal layer over the polymer bump and the integrated circuit wafer; and forming a photoresist layer over the thin conductive metal layer, the photoresist layer defining an area for exposing that portion of the thin conductive metal covering the polymer bump and at least a portion of the electrical connector; and said plating step further comprises the step of plating the ductile metal over the defined area; and further comprising the steps of:

removing the photoresist layer to expose the remaining portion of the thin conductive metal layer; and removing the remaining portion of the thin conductive metal layer.

32. The method of claim 29, wherein said defining step comprises the step of catalyzing said polymer bump to form a catalyzed polymer bump, and further wherein said plating step comprises the step of electrolessly plating said catalyzed polymer bump.

33. The method of claim 29, wherein said polymer bump comprises a polymer material having a pre-mixed catalyst, and further wherein said plating step comprises the step of electrolessly plating said polymer bump having said pre-mixed catalyst.

34. The method of claim 1, further comprising the step of plating a second metal layer over said ductile metal layer for strengthening a portion of said ductile metal layer.

35. A method for forming an electrically conductive compliant bump on a base having at least one electrical connection for connecting to the compliant bump for an adhesive flip chip integrated circuit device, the method comprising the steps of:

forming a compressible polymer bump over said electrical connection;

electrolessly plating a thin conductive metal layer on the base and the polymer bump, said thin conductive metal layer in electrical contact with the at least one electrical connection and protecting the at least one electrical connection;

forming a photoresist mask layer on the thin conductive metal layer, said photoresist mask having an opening of a size corresponding to the surface area of the compliant bump;

electrolytically plating a ductile and compliant metal layer over the surface area defined by the photoresist mask to form an electrically conductive metallization layer comprising the ductile and compliant metal layer and a portion of the thin conductive metal layer over the polymer bump and a portion of the electrical connection;

removing the photoresist mask to expose the remaining portion of the thin conductive metal layer;

removing the remaining portion of the thin conductive metal layer to form a compliant bump that is electrically conductive with the at least one electrical connection and that is compliant according to the compliant properties of the polymer bump and metallization layer;

such that the compliant bump is connectable between the at least one electrical connection and an electrical connection point through compression and adhesion of an adhesive flip chip integrated circuit.

36. The method of claim 35, further comprising the step of forming the electrically conductive compliant bump on an integrated circuit bond pad.

37. The method of claim 35, further comprising the step of forming the electrically conductive compliant bump on a substrate.

* * * * *